United States Patent
Bauchy et al.

(10) Patent No.: US 11,897,818 B2
(45) Date of Patent: Feb. 13, 2024

(54) MACHINE LEARNING CONCRETE OPTIMIZATION

(71) Applicant: CONCRETE AI, INC., Los Angeles, CA (US)

(72) Inventors: Mathieu Bauchy, Los Angeles, CA (US); Alexander Murray Hall, Pacific Palisades, CA (US)

(73) Assignee: CONCRETE AI, INC., Los Angeles, CA (US)

( * ) Notice: Subject to any disclaimer, the term of this patent is extended or adjusted under 35 U.S.C. 154(b) by 0 days.

(21) Appl. No.: 18/318,568

(22) Filed: May 16, 2023

(65) Prior Publication Data
US 2023/0416164 A1    Dec. 28, 2023

Related U.S. Application Data

(60) Provisional application No. 63/364,867, filed on May 17, 2022.

(51) Int. Cl.
| | |
|---|---|
| *C04B 40/00* | (2006.01) |
| *G06Q 10/0637* | (2023.01) |
| *G06T 11/20* | (2006.01) |
| *G06F 30/27* | (2020.01) |

(52) U.S. Cl.
CPC .......... *C04B 40/0032* (2013.01); *G06F 30/27* (2020.01); *G06Q 10/06375* (2013.01); *G06T 11/206* (2013.01)

(58) Field of Classification Search
CPC ................ C04B 40/0032; G06F 30/27; G06Q 10/06375; G06T 11/206
See application file for complete search history.

(56) References Cited

U.S. PATENT DOCUMENTS

| | | | | |
|---|---|---|---|---|
| 9,489,630 B2 * | 11/2016 | Achin | ...................... | G06N 5/02 |
| 10,366,346 B2 * | 7/2019 | Achin | .................... | G06N 20/00 |
| 10,387,900 B2 * | 8/2019 | Bledsoe | .............. | G06F 16/2477 |

(Continued)

FOREIGN PATENT DOCUMENTS

| | | |
|---|---|---|
| CN | 113836811 A | 12/2021 |
| CN | 114388069 A | 4/2022 |

OTHER PUBLICATIONS

International Search Report/Written Opinion; dated Sep. 5, 2023; in Application No. PCT/IB2023/055052, filed May 17, 2023; in 13 pages.

(Continued)

*Primary Examiner* — Ramesh B Patel
(74) *Attorney, Agent, or Firm* — Knobbe, Martens, Olson & Bear, LLP

(57) ABSTRACT

Artificial intelligence and machine learning models are used to make concrete-related predictions. Many permutations of concrete mixtures are generated. Machine learning algorithms are used to evaluate and recommend a generated concrete mixture based on a set of specifications. The generated concrete mixture can be sent to a plant for production. The actual concrete mixture that was used to manufacture the concrete product can be received from the manufacturer. An amount of emission reductions and/or cost savings can be determined from the actual as-batched concrete mixture and an associated reference concrete mixture. The real-world data are used to train the machine learning models.

20 Claims, 25 Drawing Sheets

(56) References Cited

U.S. PATENT DOCUMENTS

| | | | |
|---|---|---|---|
| 10,496,927 B2* | 12/2019 | Achin | G06N 5/02 |
| 10,558,924 B2* | 2/2020 | Achin | G06F 9/5011 |
| 11,209,813 B2* | 12/2021 | Cella | H04L 67/1097 |
| 2018/0238820 A1* | 8/2018 | Ghods | G01N 27/026 |
| 2019/0324432 A1* | 10/2019 | Cella | G05B 23/024 |
| 2019/0324439 A1* | 10/2019 | Cella | G06F 18/217 |
| 2020/0089214 A1* | 3/2020 | Cella | H04Q 9/00 |
| 2021/0063336 A1* | 3/2021 | Ghods | G06Q 50/08 |
| 2021/0094876 A1* | 4/2021 | Berodier | C04B 40/0032 |
| 2021/0365770 A1 | 11/2021 | Bhatia et al. | |
| 2022/0107251 A1* | 4/2022 | Ghods | B28B 17/0072 |

OTHER PUBLICATIONS

Lin Wang et al., 'Constructing Surrogate Model for Optimum Concrete Mixtures Using Neural Network', In: ISNN 2013: Proceedings of the 10th international conference on Advances in Neural Networks—Part II, vol. 7952, pp. 506-513, Jul. 6, 2013; pp. 508-512.

Sangyong Kim et al., 'Optimizing the Mixing Proportion with Neural Networks Based on Genetic Algorithms for Recycled Aggregate Concrete', Hindawi Publishing Corporation Advances in Materials Science and Engineering, vol. 2013, No. 527089, Aug. 13, 2013; pp. 2-9.

\* cited by examiner

Materials library
Visualize available materials

Material library at W

| Type | Sub-type | Code | Name | S.G. | Cost | A1 GWP | A2 GWP |
|---|---|---|---|---|---|---|---|
| water | potable water | WATER | ASTM C1602 Water | 1.00 | 0.00 $/gal | 0.005 tn/tn | 0.00 tn/tn |
| cement | cement II/V | CEM25 | ASTM C150 Type II/V Cement | 3.15 | 150.00 $/tn | 0.922 tn/tn | 0.00 tn/tn |
| SCM | fly ash type F | FLYASH | ASTM C618 Class F Fly Ash | 2.00 | 120.00 $/tn | 0.00 tn/tn | 0.00 tn/tn |
| SCM | slag | SLAG | ASTM C989 Slag | 2.92 | 125.00 $/tn | 0.147 tn/tn | 0.00 tn/tn |
| coarse | #57 | GRNT57 | ASTM C33 #57, 1x4 Granite | 2.84 | 30.00 $/tn | 0.00363 tn/tn | 0.00 tn/tn |
| coarse | #67 | GRVL67 | ASTM, C33 #67, 3/4x4 Gravel | 2.669 | 25.00 $/tn | 0.00363 tn/tn | 0.00 tn/tn |
| coarse | #7 | GRNT7 | ASTM C33 #7, 1/2x4 Granite | 2.76 | 35.00 $/tn | 0.00363 tn/tn | 0.00 tn/tn |
| coarse | #8 | GRVL8 | ASTM C33 #8, 3/8x4 Gravel | 2.652 | 22.00 $/tn | 0.00363 tn/tn | 0.00 tn/tn |
| coarse | #9 | GRVL9 | ASTM C33 #9, 4x16 Gravel | 2.64 | 15.00 $/tn | 0.00363 tn/tn | 0.00 tn/tn |
| fine | blend sand | BLDSND | ASTM C33 Blend Sand | 2.64 | 25.00 $/tn | 0.00354 tn/tn | 0.00 tn/tn |
| fine | top sand | CNCSND | ASTM C33 Concrete Sand | 2.644 | 25.00 $/tn | 0.00354 tn/tn | 0.00 tn/tn |
| chemical | accelerator | ADACC | ASTM C494 Accelerator | 1.40 | 5.00 $/gal | 1.34 tn/tn | 0.00 tn/tn |
| chemical | high-range plasticizer | ADHRWRA | ASTM C494 HRWRA | 1.08 | 15.00 $/gal | 1.53 tn/tn | 0.00 tn/tn |

FIG. 3 concrete.ai platform

Home  Materials  Prediction  Optimization optimization • Plant: W

Mix optimization
Select concrete mix to be optimized

Select plant

Plant  [ AI001 - W  v ]  — 402

Select plant

[ Submit ]

---

Select or type mix design from AI001 - W

Reference mix

```
MX001 - 5.5 sk, 3,000 psi 15% Fly Ash
MX002 - 6.0 sk, 4,000 psi 15% Fly Ash
MX003 - 6.5 sk, 4,500 psi 15% Fly Ash
MX004 - 7.0 sk, 5,000 psi 15% Fly Ash
MX005 - 7.5 sk, 5,500 psi 15% Fly Ash
MX006 - 8.0 sk, 5,500 psi 15% Fly Ash
```
— 404

[ Submit ]

FIG. 4A

Home  Materials  Prediction  Optimization concrete.ai platform    optimization • Plant: W    • Mix: MX001    • Cost minimization

Optimized mix design information — 418

| MX001-AI | Save this mix |
|---|---|

Mix Constituents

| Code | Name | Quantity | Optimized |
|---|---|---|---|
| WATER | ASTM C1602 Water | 34 gal/cy | 29 gal/cy |
| CEM25 | ASTM C150 Type II/V Cemen.. | 440 lb/cy | 141 lb/cy |
| FLYASH | ASTM C618 Class F Fly Ash | 77 lb/cy | 94 lb/cy |
| SLAG | ASTM C989 slag | | 235 lb/cy |
| GRNT57 | ASTM C33#57, 1x4 Grani.. | 1750 lb/cy | |
| GRVL67 | ASTM C33#67, 3/4x4 Gr.. | | 1525 lb/cy |
| GRVL9 | ASTM C33#9, 4x16 Grav.. | | 508 lb/cy |
| CNCSND | ASTM C33 Concrete Sand | 1514 lb/cy | |
| BLDSND | ASTM C33 Blend Sand | | 1251 lb/cy |
| ADHRWRA | ASTM C494 HRWRA | 4 oz/cwt | 1 oz/cwt |
| AIR | Air content | 2% | 2% |

Mix design properties

Adjust constraints?

Objective of the optimization
Constraints on water

W/CM ratio  [0.20]  [0.60]
            Enter min water-to-    Enter max water-to-
            cementitious ratio     cementitious ratio Water volume  [29.0]  [36.0]
              Enter min water    Enter max water
              volume in gal/cy   volume in gal/cy Constraints on cementitious materials
Constraints on coarse aggregates
Constraints on fine aggregates
Constraints on gradation
Constraints on chemical admixtures
Constraints on number of constituents

[Re-optimize] — 420

FIG. 4D

| Home | Materials | Prediction | Optimization | | |
|---|---|---|---|---|---|
| concrete.ai platform | optimization • Plant: W | • Mix: MX001 | • Cost minimization | | 422 |

| | | | volume in gal/cy | volume in gal/cy |
|---|---|---|---|---|
| SLAG | ASTM C989 slag | 235 lb/cy | | |
| GRNT57 | ASTM C33#57, 1x4 Grani.. | 1750 lb/cy | | |
| GRVL67 | ASTM C33#67, 3/4x4 Gr.. | 1525 lb/cy | | |
| GRVL9 | ASTM C33#9, 4x16 Grav.. | 508 lb/cy | | |
| CNCSND | ASTM C33 Concrete Sand | 1514 lb/cy | | |
| BLDSND | ASTM C33 Blend Sand | 1251 lb/cy | | |
| ADHRWRA | ASTM C494 HRWRA | 4 oz/cwt | | |
| AIR | Air content | 2% | | |

Mix calculated properties

Constraints on cementitious materials

| | | |
|---|---|---|
| Total cementitious | 470 — Enter min cementitious weight in lb/cy | 752 — Enter max cementitious weight in lb/cy |
| ASTM C150 Type.. weight | 0 — Enter min cement weight in lb | 1000 — Enter max cement weight in lb/cy |
| Total cement replacement% | 0 — Enter min cement replacement in weight% | 80 — Enter max cement replacement in weight% |
| Replacement% by ASTM C618 Clas.. | 0 — Enter min cement replacement in weight% | 30 — Enter max cement replacement in weight% |
| ASTM C618 Clas.. weight | 0 — Enter min SCM weight in lb/cy | 1000 — Enter max SCM weight in lb/cy |
| Replacement% by ASTM C989 Slag | 0 — Enter min cement replacement in weight% | 50 — Enter max cement replacement in weight% |

FIG. 4E

Home | Materials | Prediction | Optimization concrete.ai platform Prediction ○ Plant: W

Prediction of mix performance
Select concrete mix to be analyzed

Select plant

Plant [ AI001 - W ▾ ] — 702
Select plant
[ Submit ]

Select or type mix design from AI001 - W

Reference mix [ MX001 - 5.5 sk, 3,000 psi 15% Fly Ash ▾ ] — 704A
Option 1: Select a reference mix from the list
[ Mix code ] — 704B
Option 2: Enter the code of a reference mix
[ Submit ]

FIG. 7A

Home  Materials  Prediction  Optimization concrete.ai platform  Prediction  ○ Plant: W  ○ Mix: MX001

Mix design information —706

Mix design MX001 constituents (W)

| Type | Code | Name | Quantity |
|---|---|---|---|
| water | WATER | ASTM C1602 Water | 34 gal/cy |
| cement | CEM25 | ASTM C150 Type II/V Cemen... | 440 lb/cy |
| scm | FLYASH | ASTM C618 Class F Fly Ash | 77 lb/cy |
| coarse | GRNT57 | ASTM C33 #57, 1x4 Granite | 1750 lb/cy |
| fine | CNCSND | ASTM C33 Concrete Sand | 1514 lb/cy |
| chemical | ADHRWRA | ASTM C494 HRWRA | 4 oz/cwt |
| air | AIR | Air content | 2% |

Specified strength
Other performance targets
Mix constraints
Calculated properties

Mix design properties —712

Predicted properties —714

| Property | Target | Prediction | Confidence |
|---|---|---|---|
| 1d strength | | 884 psi | ±275 psi |
| 3d strength | | 1919 psi | ±211 psi |
| 7d strength | | 2710 psi | ±208 psi |
| 28d strength | > 4000 psi | 4387 psi | ±443 psi |
| 56d strength | | 5306 psi | ±621 psi |
| 90d strength | | 5917 psi | ±601 psi |
| 28d strength/CM | | 8.5 psi/lb | |
| Slump | 4 ± 1 in | 4.2 in | ±0.3 in |
| 28d shrinkage | < 0.000 % | 0.051 % | ±0.004 % |
| Min. pump line size | < 4 in | 4 in | |

Predicted strength development

FIG. 7C

MACHINE LEARNING CONCRETE OPTIMIZATION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims benefit of U.S. Provisional Patent Application Ser. No. 63/364,867 entitled "CRYPTOGRAPHIC BLOCKHAIN SYSTEM AND METHODS FOR NON-FUNGIBLE TOKENS OF CONCRETE MIXTURE RELATED CARBON CREDITS" filed May 17, 2022, which is hereby incorporated by reference in its entirety.

BACKGROUND

Artificial neural networks are a class of models in machine learning. Neural networks typically have several layers. The first layer is an input layer. The first layer can be followed by a number of hidden layers. The last layer is the output layer. Layers consist of neurons. The neurons in one layer are connected to neurons in the following layer. In the neural network, each edge connecting neurons can be associated with a weight. Every neuron can have a bias. Weights and bias can be updated during training of the neural network. Neural networks can be trained using backpropagation. Input into a neuron can be a linear combination of weighted outputs from neurons in the previous layer and a bias. A neuron's output can be obtained by passing the input to the neuron to an activation function. Generally, existing machine learning models, such as neural networks, and existing machine learning techniques can be good at making interpolated predictions.

Concrete is a composite material made of fine and coarse aggregate bound together by a liquid binder (such as cement paste) that hardens over time. Concrete is a popular choice in many construction and building projects due to its relative cost, versatility, and strength, among other factors. However, a downside of concrete is its carbon footprint. Carbon dioxide is a byproduct of the process to create cement, a common ingredient in concrete. The cement industry produces approximately eight percent of carbon-dioxide emissions worldwide.

SUMMARY

The systems, methods, and devices described herein each have several aspects, no single one of which is solely responsible for its desirable attributes. Without limiting the scope of this disclosure, several non-limiting features will now be discussed briefly.

According to an embodiment, a system is disclosed comprising: a data storage medium; and one or more computer hardware processors in communication with the data storage medium, wherein the one or more computer hardware processors are configured to execute computer-executable instructions to at least: receive one or more input parameters related to generating an artificial intelligence concrete mixture; receive a first constraint on the artificial intelligence concrete mixture, wherein the first constraint comprises a threshold on a concrete mixture constituent; generate a plurality of candidate concrete mixtures; identify, from the plurality of candidate concrete mixtures, a subset of candidate concrete mixtures, wherein identifying the subset of candidate concrete mixtures comprises: determining that a candidate concrete mixture from the subset satisfies the threshold on the concrete mixture constituent; for each particular candidate concrete mixture from the subset of candidate concrete mixtures, generate input data for the particular candidate concrete mixture; and invoke a machine learning model, wherein the machine learning model receives the input data as input, wherein the machine learning model outputs a prediction based on the input data; identify, from the subset of candidate concrete mixtures, a filtered set of candidate concrete mixtures, wherein the filtered set of candidate concrete mixtures comprises (i) a first candidate concrete mixture and (ii) a second candidate concrete mixture, wherein identifying the filtered set of candidate concrete mixtures comprises: determining that a particular prediction for the particular candidate concrete mixture fails to satisfy a target performance threshold based on the one or more input parameters; apply an optimization function to the first candidate concrete mixture and the second candidate concrete mixture, wherein the optimization function selects the first candidate concrete mixture over the second candidate concrete mixture; and provide the first candidate concrete mixture as the artificial intelligence concrete mixture.

According to an embodiment, a system is disclosed comprising: a data storage medium; and one or more computer hardware processors in communication with the data storage medium, wherein the one or more computer hardware processors are configured to execute computer-executable instructions to at least: receive one or more input parameters related to generating an artificial intelligence concrete mixture, the one or more input parameters comprising a cost and global warming potential objective; generate a plurality of candidate concrete mixtures; for each particular candidate concrete mixture from the plurality of candidate concrete mixtures, generate input data for the particular candidate concrete mixture; and invoke a machine learning model, wherein the machine learning model receives the input data as input, wherein the machine learning model outputs a respective prediction based on the input data; identify, from the plurality of candidate concrete mixtures, a filtered set of candidate concrete mixtures, wherein the filtered set of candidate concrete mixtures comprises (i) a first candidate concrete mixture and (ii) a second candidate concrete mixture, wherein identifying the filtered set of candidate concrete mixtures comprises: determining that a particular prediction for the particular candidate concrete mixture fails to satisfy a target performance threshold based on the one or more input parameters; apply an optimization function to the first candidate concrete mixture and the second candidate concrete mixture according to the cost and global warming potential objective, wherein the optimization function selects the first candidate concrete mixture over the second candidate concrete mixture; and provide the first candidate concrete mixture as the artificial intelligence concrete mixture.

According to an aspect, the one or more computer hardware processors may be configured to execute computer-executable instructions to at least: calculate a coarseness factor value for the first candidate concrete mixture; calculate a workability factor value for the first candidate concrete mixture; and present, in a graphical user interface, a Shilstone visualization comprising a point in the Shilstone visualization representing the coarseness factor value and the workability factor value.

According to an aspect, the one or more computer hardware processors may be configured to execute computer-executable instructions to at least: determine an expected retention value for the first candidate concrete mixture for a particular sieve size; and present, in a graphical user interface, a tarantula visualization comprising a point in the tarantula visualization representing the expected retention value for the particular sieve size.

According to an aspect, the one or more input parameters may comprise the target performance threshold.

According to an aspect, the target performance threshold may correspond to at least one of a strength threshold, a slump threshold, or a shrinkage threshold.

According to an aspect, the one or more input parameters may comprise a reference concrete mixture, the one or more computer hardware processors may be configured to execute computer-executable instructions to at least: generate reference input data for the reference concrete mixture; and invoke the machine learning model, wherein the machine learning model receives the reference input data as input, wherein the machine learning model outputs a reference prediction based on the reference input data, wherein the target performance threshold is based on the reference prediction.

According to an aspect, generating input data for the particular candidate concrete mixture may comprise: determining a first feature corresponding to a water-to-cementitious material ratio for the particular candidate concrete mixture; determining a second feature corresponding to an aggregate density value for the particular candidate concrete mixture; determining a third feature corresponding to an aggregate water absorption value for the particular candidate concrete mixture; determining a fourth feature corresponding to an aggregate fineness modulus value for the particular candidate concrete mixture; determining a fifth feature for an amount of a concrete mixture constituent in the particular candidate concrete mixture; and converting the first feature, second feature, third feature, fourth feature, and fifth feature to vector data, wherein the input data comprises the vector data.

According to an aspect, generating the plurality of candidate concrete mixtures may comprise: creating the first candidate concrete mixture comprising a plurality of concrete mixture constituents; assigning a first value for a first concrete mixture constituent in the plurality of concrete mixture constituents for the first candidate concrete mixture; adding the first candidate concrete mixture to the plurality of candidate concrete mixtures; combining the first value and a step value to result in a second value; creating a second candidate concrete mixture comprising the plurality of concrete mixture constituents; assigning the second value for the first concrete mixture constituent for the second candidate concrete mixture; and adding the second candidate concrete mixture to the plurality of candidate concrete mixtures.

According to an aspect, wherein generating the plurality of candidate concrete mixtures may comprise: creating a second candidate concrete mixture comprising a plurality of concrete mixture constituents; determining a value associated with the second candidate concrete mixture; determining that the value associated with the second candidate concrete mixture fails to satisfy a domain threshold; and excluding the second candidate concrete mixture from the plurality of candidate concrete mixtures.

According to an aspect, the one or more input parameters may comprise a reference concrete mixture.

According to an aspect, the one or more computer hardware processors may be configured to execute computer-executable instructions to at least: calculate a first performance metric associated with the first candidate concrete mixture; calculate a second performance metric associated with the reference concrete mixture; and cause presentation, in a graphical user interface, of a visualization comprising the first performance metric and the second performance metric.

According to an aspect, the one or more computer hardware processors may be configured to execute computer-executable instructions to at least: generate first input data for the first candidate concrete mixture; for each particular machine learning model from a plurality of machine learning models, invoke the particular machine learning model, wherein the particular machine learning model receives the first input data as input; and apply a statistical measure to output from each particular machine learning model from the plurality of machine learning models, wherein application of the statistical measure outputs a first prediction.

According to an aspect, the one or more computer hardware processors may be configured to execute computer-executable instructions to at least: calculate a confidence interval from the output from each particular machine learning model from the plurality of machine learning models, wherein identifying the filtered set of candidate concrete mixtures comprises: determining that the first prediction combined with the confidence interval satisfies the target performance threshold.

According to an embodiment, a method is disclosed comprising: generating a plurality of clusters from a plurality of concrete mixtures; selecting, from the plurality of clusters, a first subset of clusters, wherein one or more other clusters from the plurality of clusters are excluded from the first subset of clusters; creating, from the first subset of clusters, a first training data set; determining a first set of hyperparameters; training a first machine learning model using the first training data set and the first set of hyperparameters; validating the first machine learning model using the one or more other clusters; determining a second set of hyperparameters different from the first set of hyperparameters; and training a second machine learning model using a second training data set and the second set of hyperparameters.

According to an aspect, generating the plurality of clusters may comprise: applying a K-means clustering algorithm to the plurality of concrete mixtures.

According to an aspect, creating the first training data set may comprise: adding a label to the first training data set, wherein the label corresponds to at least one of: a strength value, a slump value, or a shrinkage value.

According to an aspect, the method may further comprise: selecting, from the plurality of clusters, a second subset of clusters different from the first subset of clusters; and creating, from the second subset of clusters, the second training data set.

According to an aspect, validating the first machine learning model may comprise: generating input data for a concrete mixture from the one or more other clusters; invoking the first machine learning model, wherein the first machine learning model receives the input data as input, wherein the first machine learning model outputs a prediction based on the input data; and comparing the prediction to a metric associated with the concrete mixture from the one or more other clusters.

According to an aspect, the first set of hyperparameters may comprise at least one of a number of neurons, a number of layers, a number of training epochs, an activation function, an optimizer, a learning rate, a batch size, or a regularization parameter.

According to an embodiment, a system is disclosed comprising: a data storage medium; and one or more computer hardware processors in communication with the data storage medium, wherein the one or more computer hardware processors are configured to execute computer-executable instructions to at least: receive one or more input parameters related to generating an aggregate blend; generate a plurality of candidate aggregate blends based on the one or more input parameters; identify, from the plurality of candidate aggregate blends, a filtered set of candidate aggregate blends, wherein identifying the filtered set of candidate aggregate blends further comprises: calculating a particular performance metric for a particular aggregate blend from the plurality of candidate aggregate blends, determining that the particular performance metric for the particular aggregate blend fails to satisfy a domain threshold, and excluding the particular aggregate blend from the filtered set of candidate aggregate blends, wherein the filtered set of candidate aggregate blends comprises (i) a first aggregate blend and (ii) a second aggregate blend; calculate (i) a first cost associated with the first aggregate blend and (ii) a second cost associated with the second aggregate blend; apply an optimization function to the first cost and the second cost, wherein the optimization function selects the first cost associated with the first aggregate blend over the second cost associated with the second aggregate blend; and provide the first aggregate blend.

In various aspects, systems and/or computer systems are disclosed that comprise a computer readable storage medium having program instructions embodied therewith, and one or more processors configured to execute the program instructions to cause the one or more processors to perform operations comprising one or more of the above- and/or below-aspects (including one or more aspects of the appended claims).

In various aspects, computer-implemented methods are disclosed in which, by one or more processors executing program instructions, one or more of the above- and/or below-described aspects (including one or more aspects of the appended claims) are implemented and/or performed.

BRIEF DESCRIPTION OF THE DRAWINGS

These and other features, aspects, and advantages are described below with reference to the drawings, which are intended for illustrative purposes and should in no way be interpreted as limiting the scope of the embodiments. Furthermore, various features of different disclosed embodiments can be combined to form additional embodiments, which are part of this disclosure. In the drawings, like reference characters can denote corresponding features throughout similar embodiments. The following is a brief description of each of the drawings.

FIG. 3 depicts a material library user interface of the artificial intelligence prediction system.

FIGS. 4A-4G depict optimization user interfaces of the artificial intelligence prediction system.

FIGS. 7A-7D depict prediction user interfaces of the artificial intelligence prediction system.

DETAILED DESCRIPTION

Figure 1:
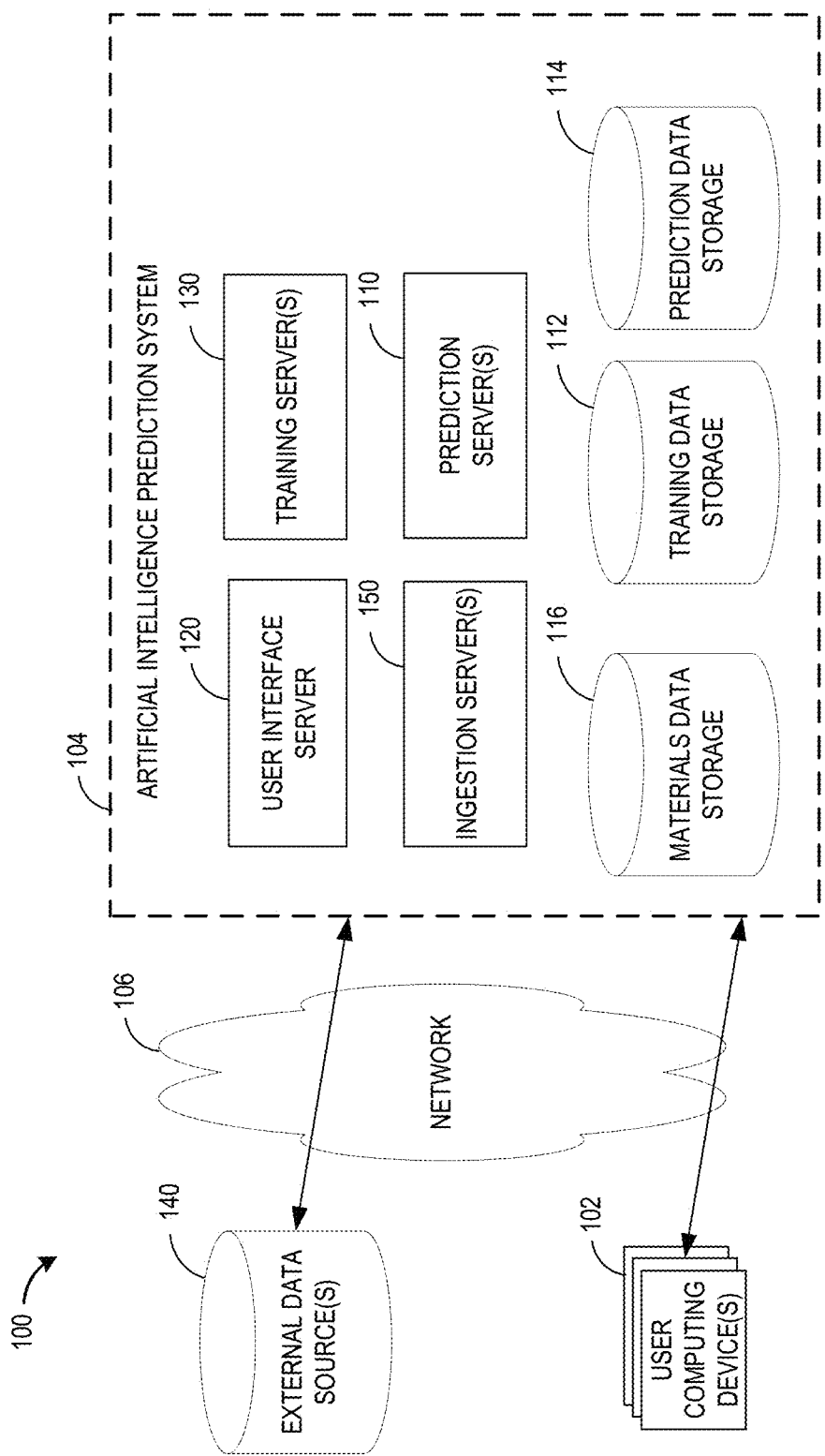
FIG. 1 is a block diagram depicting an illustrative network environment for implementing an artificial intelligence prediction system.

As described above, existing machine learning models, such as neural networks, and existing machine learning techniques can be good at making interpolated predictions. However, depending on how existing machine learning models are tuned and trained, the trained machine learning models can suffer from overfitting. Overfitting occurs when a trained machine learning model gives accurate predictions for training data but not for new data. In the context of using machine learning models to make predictions associated with concrete mixtures, some existing machine learning models can make relatively good predictions associated with concrete mixtures that are similar to the training data but relatively poor predictions for concrete mixtures that are too different from the training data. In other words, some existing machine learning models and techniques may be good at interpolation but poor at extrapolation.

Artificial intelligence can be used to make concrete-related predictions. In particular, artificial intelligence and machine learning algorithms can be used to evaluate and recommend a generated concrete mixture based on a set of specifications, which can include predicted metrics, such as, but not limited to predicted emissions reductions and/or cost. The system can also assist in determining concrete mixtures that preferably use up material supply of an organization and/or plant. The generated concrete mixture can be sent to a plant for production. The actual concrete mixture that was used to manufacture the concrete product can be received from the manufacturer. An amount of emission reductions and/or cost savings can be determined from the actual as-batched concrete mixture and an associated reference concrete mixture. The real-world data can be used to train the machine learning models. The machine learning models can be applied to predict the performance of concrete based on the constituent materials. In some embodiments, the artificial intelligence algorithms can optimize concrete mixtures to lower costs and/or emissions while maintaining equal or improving performance.

As used herein, "optimize" can refer to the process of improving a concrete mixture as predicted by artificial intelligence. An "optimal" or "optimized" concrete mixture need not be the best mixture to meet performance targets and/or optimization objectives.

Some existing optimization techniques, such as a conjugate gradient method, may be inaccurate. As described herein, the number of candidates for a concrete mixture can be large and existing optimization techniques can avoid checking every possible candidate. However, these existing techniques run the risk of getting stuck in local minima (or maxima or zero) of outputs from an objective function. The solutions and techniques described herein can avoid getting stuck in local minima (or maxima or zero) of outputs from an objective function by trying the candidates in a permutation matrix with efficient artificial intelligence algorithms, such as by using predictive machine learning models, which can result in an improved candidate recommendation. Thus, a computer processor executing these improved algorithms can result in more accurate optimization recommendations. Accordingly, the systems and methods described herein may improve optimization technology and the accuracy of automated computer processor recommendations.

In an optimization context, an optimization algorithm is applied to a search space. In a concrete context, in order to recommend a candidate mixture, a naïve approach would be to have a computer process as many candidate mixtures as possible in parallel. However, if a candidate mixture has ten to twenty constituents (which can depend on the organization) and each constituent has different possible values, then the number of candidate mixtures could be in the hundreds of millions. Due to the large number of candidate mixtures and the hardware limitations of many computers, a computer naively processing all of the candidate mixtures would likely run out of memory. Therefore, the solutions and techniques described herein can generate the multiple batches and each batch can be processed in serial or in parallel by one or more computers to avoid the out of memory issue. Moreover, the batches can be filtered based on one or more constraints, which can result in fewer candidate mixtures for processing. Therefore, the systems and methods described herein may improve the operation of a computer by advantageously avoiding out of memory and other computer hardware limitations associated with executing optimization algorithms on a large search space.

In the context of machine learning, robustness can refer to the degree that a machine learning model's effectiveness changes when presented with new data versus training data. Some existing machine learning techniques can lack robustness. In other words, some existing machine learning techniques may result in a machine learning model's recommendations being less accurate when presented with new data versus training data. Some conventional training methods randomly select datapoints to build the training set (without any preliminary clustering), which can result in overfitting since a machine learning model can be validated based on its ability to predict properties based in input that is potentially very similar to those in the training set. In some aspects, the techniques described herein, such particular techniques used for training and machine learning validation, can advantageously improve the robustness of machine learning models, such as improving the accuracy of existing machine learning techniques. For example, the initial data can be clustered and some of the clusters can be used in the training data while other clusters can be excluded from the training data. After a machine learning model is trained, the excluded data can be used to validate the machine learning model. If the trained machine learning models exhibit overfitting, then the process can be repeated again while changing the hyperparameters used to train new machine learning models, which can result in more robust machine learning models. Accordingly, the systems and methods described herein may improve machine learning technology.

In a conventional machine learning optimization context, confidence is not typically taken into account. Some existing deep learning models do not calculate their own confidence. However, in some aspects, the systems and methods described herein exploit both the knowledge of the predicted performance and the uncertainty thereof when optimizing a mixture. The systems and methods described herein can recommend a concrete mixture that exhibits a balance between (i) maximum savings and (ii) a minimum confidence interval range. For example, a concrete mixture that is predicted to have a very high strength and a very low cost may not be selected if it also comes with a very large uncertainty in its predicted strength. Accordingly, the systems and methods described herein may improve machine learning optimization technology.

Regulations and/or international treaties, such as the 2015 Paris Agreement, can be aimed at reducing greenhouse gas emissions, such as carbon dioxide. These regulations can establish a system of carbon accounting and trading. These carbon systems can curb greenhouse gas emissions by placing fees on gashouse emissions and/or providing incentives for reductions in emissions by organizations. As part of these systems, a carbon credit is a permit that allows the credit owner to emit a certain amount of carbon dioxide or other greenhouse gases. Carbon credits are generated from projects that keep emissions from being released or that remove gases from the atmosphere. Carbon credits can be generated from the manufacture of concrete products.

The systems and methods described herein can advantageously reduce cost and carbon dioxide emissions by optimizing concrete mixtures. The graphical user interfaces described herein can be configured to receive user input and output concrete mixtures based on machine-learning-based algorithms. The machine learning algorithms can advantageously reduce cost and/or embodied carbon dioxide through the reduction and/or substitution of cement, which can be the most expensive and carbon-dioxide-intensive constituent of concrete. In some cases, reduction of embodied carbon dioxide may also yield a cost reduction. The machine learning algorithms can further improve waste reduction based on the selection of components for a mixture. In some embodiments, the system can be provided under a software-as-a-service model.

The processes described herein can optimize a reference concrete mixture. The design can be evaluated by machine learning algorithms and the embodied carbon dioxide can be calculated using third party verification in the form of an environmental product declaration (EPD), such as those produced by ClimateEarth. An optimized design is then formulated using machine learning algorithms and a second environmental product declaration is generated that reflects an improved embodied carbon dioxide value. If the client accepts the new mixture, the optimized concrete product is then produced at the plant. The actual (as-batched) quantities used to create the mixture can be forwarded to generate a final environmental product declaration. The carbon credit can be the difference between the embodied carbon dioxide value of the reference mixture and the actual mixture. Some international standards allow for a difference of one percent of cementitious materials and three percent of the aggregate material, and, therefore, using actual values instead of theoretical values may offer a more accurate accounting of the avoided carbon dioxide emission.

Turning to FIG. 1, an illustrative network environment 100 is shown in which an artificial intelligence prediction system 104 may make concrete-related predictions. The network environment 100 may include one or more user computing devices 102, one or more external data sources 140, and the artificial intelligence prediction system 104. The constituents of the network environment 100 may be in communication with each other either locally or over a network 106. While certain constituents of the network environment 100 are depicted as being in communication with one another, any constituent of the network environment 100 can communicate with any other constituent of the network environment 100; however, not all of these communication lines are depicted in FIG. 1. The user computing devices 102 can include, but are not limited to, a laptop or tablet computer, personal computer, personal digital assistant (PDA), hybrid PDA/mobile phone, smart wearable device (such as a smart watch), mobile phone, and/or a smartphone.

The artificial intelligence prediction system 104 may include a user interface server 120, one or more ingestion servers 150, one or more training servers 130, one or more prediction servers 110, a materials data storage 116, a training data storage 112, and a prediction data storage 114. The ingestion server 150 can ingest data from the external data source(s) 140. In some embodiments, the external data source(s) 140 can include materials data, which can be specific to particular concrete manufacturing plants. Data in the external data source(s) 140 can be from quality control software used at the plants. The ingested data can include a cost of each material and a global warming potential (GWP) value for each material. The ingested data can further include, but is not limited to, a performance for each material and physical and/or chemical characteristics of each material. The training server 130 can train one or more machine learning models using training data. The prediction server 110 can make a prediction based on input data and one or more trained machine learning models. In some embodiments, the prediction server 110 can use metadata from the prediction data storage 114 to make predictions. The user interface server 120 can cause presentation of a graphical user interface. A user computing device 102 can access the graphical user interface. The graphical user interface can display outcome predictions. The predictions from the prediction server 110 can include, but are not limited to, artificial intelligence concrete mixtures, predicted concrete performance, and/or recommended aggregate blends.

As described herein, a user can use the prediction features of the artificial intelligence prediction system 104 to predict the performance of an existing concrete mixture. In some cases, the prediction features can be used to confirm that an existing concrete mixture meets the performance requirements it is supposed to meet before optimizing the mixture. A user can use the prediction features to forecast what will be the performance of a given concrete mixture and to ensure that a concrete mixture will still achieve its specified performance even if the materials change (e.g., change in the physical or chemical properties of the materials the mixture is made of). Additional details regarding prediction are described herein, such as with respect to FIGS. 7A-7D.

As described herein, the prediction features of the artificial intelligence prediction system 104 can be used to predict the performance of candidate concrete mixtures during optimization—to ensure that the specific concrete mixture can meet the performance target(s). In some embodiments, prediction may be performed as late as possible during optimization (after executing constraints-based filters) since this task (i.e., running the machine learning model(s)) can be the most computationally expensive part of the optimization process. It may be advantageous to first filter out all the mixes that do not meet the imposed constraints (such as, but not limited to, water-to-cementious ratio, workability, or coarseness out of range, etc.) to minimize the number of mixes that are provided to the machine learning model(s).

The materials data storage 116, the training data storage 112, and/or the prediction data storage 114 may be embodied in hard disk drives, solid state memories, any other type of non-transitory computer-readable storage medium. The materials data storage 116, the training data storage 112, and/or the prediction data storage 114 may also be distributed or partitioned across multiple local and/or remote storage devices. The materials data storage 116, the training data storage 112, and/or the prediction data storage 114 may include a data store. As used herein, a "data store" can refer to any data structure (and/or combinations of multiple data structures) for storing and/or organizing data, including, but not limited to, relational databases (e.g., Oracle databases, MySQL databases, etc.), non-relational databases (e.g., NoSQL databases, etc.), key-value databases, in-memory databases, tables in a database, and/or any other widely used or proprietary format for data storage.

The network 106 may be any wired network, wireless network, or combination thereof. In addition, the network 106 may be a personal area network, local area network, wide area network, cable network, satellite network, cellular telephone network, or combination thereof. In addition, the network 106 may be a publicly accessible network of linked networks, possibly operated by various distinct parties, such as the Internet. In some embodiments, the network 106 may be a private or semi-private network, such as a corporate or university intranet. The network 106 may include one or more wireless networks, such as a Global System for Mobile Communications (GSM) network, a Code Division Multiple Access (CDMA) network, a Long-Term Evolution (LTE) network, or any other type of wireless network. The network 106 can use protocols and components for communicating via the Internet or any of the other aforementioned types of networks, such as HTTP, TCP/IP, and/or UDP/IP.

The user computing devices 102 and/or the artificial intelligence prediction system 104 may each be embodied in a plurality of devices. Each of the user computing devices 102 and/or the artificial intelligence prediction system 104 may include a network interface, memory, hardware processor, and non-transitory computer-readable medium drive, all of which may communicate with each other by way of a communication bus. The network interface may provide connectivity over the network 106 and/or other networks or computer systems. The hardware processor may communicate to and from memory containing program instructions that the hardware processor executes in order to operate the user computing devices 102 and/or the artificial intelligence prediction system 104. The memory generally includes RAM, ROM, and/or other persistent and/or auxiliary non-transitory computer-readable storage media.

Additionally, in some embodiments, the artificial intelligence prediction system 104 or components thereof (such as the ingestion servers 150, the training servers 130, the prediction servers 110, the materials data storage 116, the training data storage 112, and/or the prediction data storage 114) are implemented by one or more virtual machines implemented in a hosted computing environment. The hosted computing environment may include one or more rapidly provisioned and/or released computing resources. The computing resources may include hardware computing, networking and/or storage devices configured with specifically configured computer-executable instructions. A hosted computing environment may also be referred to as a "serverless," "cloud," or distributed computing environment.

Figure 2:
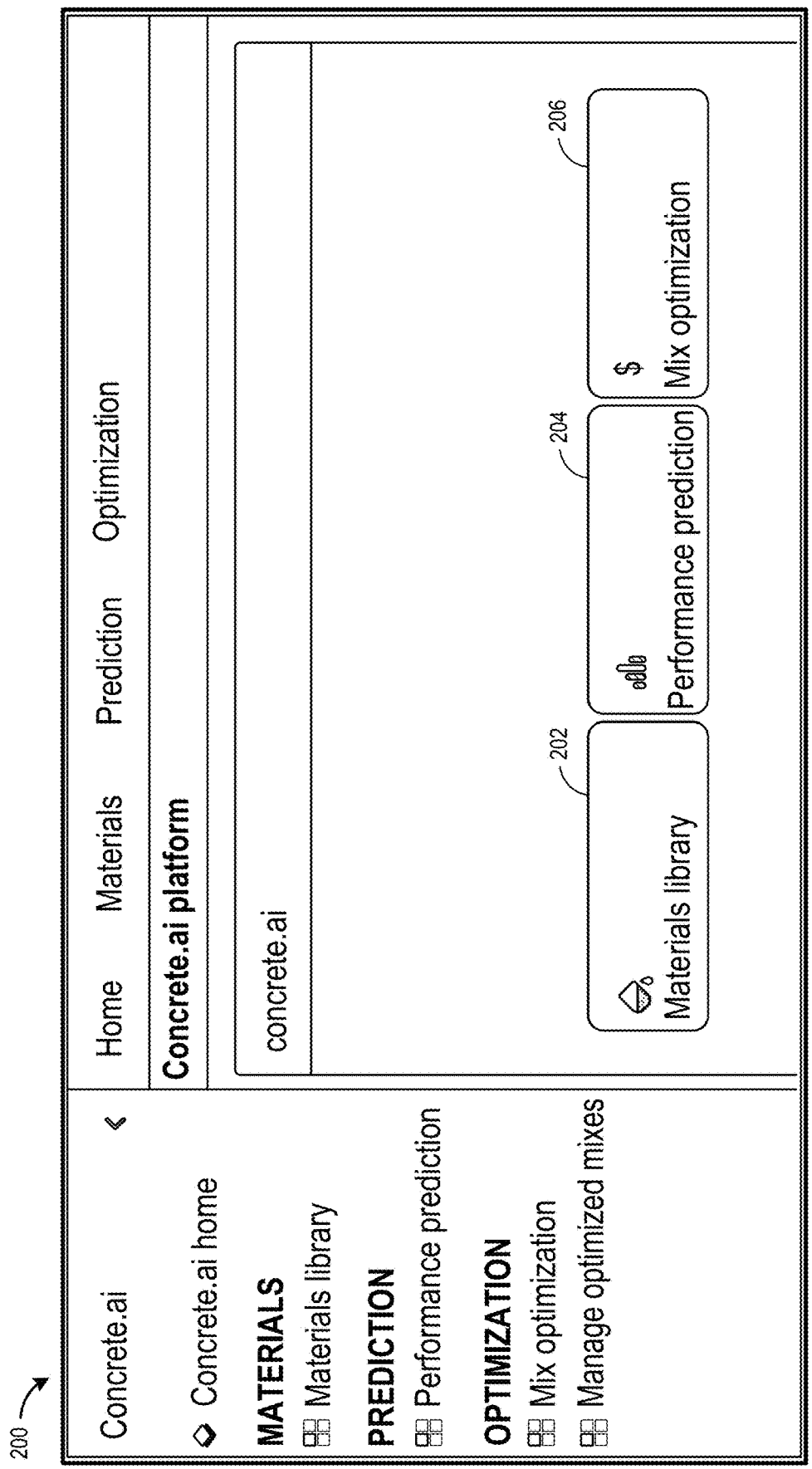
FIG. 2 depicts a graphical user interface of the artificial intelligence prediction system.

FIG. 2 depicts a graphical user interface 200 of the artificial intelligence prediction system 104. The graphical user interface 200 can be a launch page. A user can access a materials library user interface via selection of the first user interface element 202. A user can access a performance prediction user interface via selection of the second user interface element 204. A user can access a concrete mixture optimization user interface via selection of the third user interface element 206.

FIG. 3 depicts a material library user interface 300 of the artificial intelligence prediction system 104. The material library user interface 300 can include multiple material entries 302. Each material can have attributes and attribute values. As described herein, the materials shown in the material library user interface 300 can be the materials available at a specific plant (here plant "W"). As shown, types of materials can include, but are not limited to, water, cement, supplementary cementing material (SCM), coarse aggregates, fine aggregates, and/or chemicals. Also as shown, each material can have a sub-type. SCM can also be referred to as a cement replacement material. As shown, each material can have a name, a specific gravity (S.G.), a cost, and/or a GWP. As described herein, the materials can have additional attributes and attribute values, such as performance attributes and values (including, but not limited to, saturated-surface-dry density, absorption, gradation, fineness, and/or chemical composition), which may not be shown in the graphical user interface 300. As described herein, the artificial intelligence prediction system 104 can use data from the materials library to make artificial intelligence predictions.

Figure 4B:
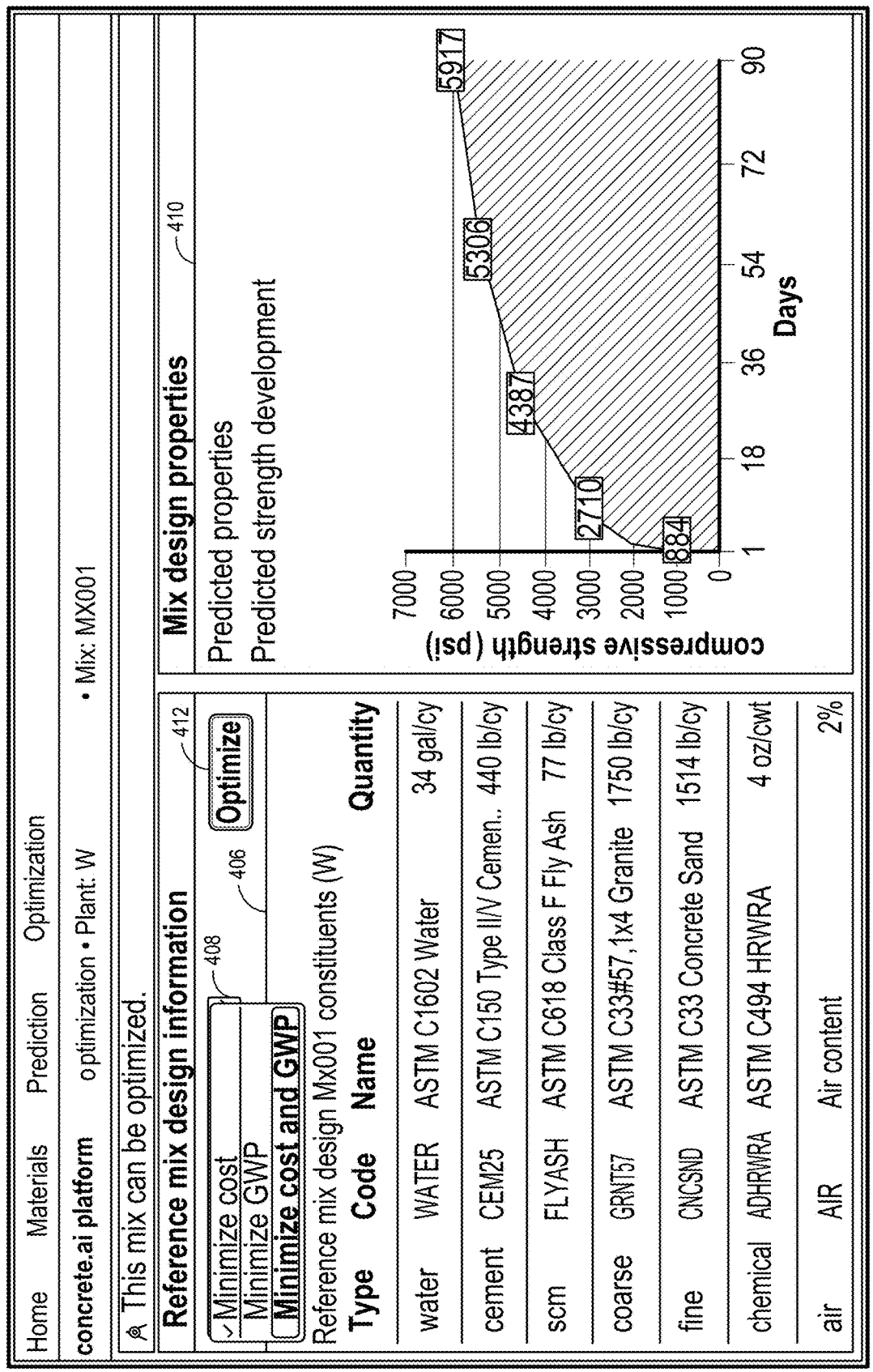

FIGS. 4A-4G depict optimization user interfaces 400 of the artificial intelligence prediction system 104. In FIG. 4A, the optimization user interface 400 can include a plant selector 402 and a mixture selector 404. A user, with the plant selector 402 and the mixture selector 404, can select a specific plant and a specific reference mixture available at the selected plant. To optimize the selected reference mixture, the artificial intelligence prediction system 104 can first predict the performance of the reference mixture, as described herein. The artificial intelligence prediction system 104 can then automatically generate a new mixture to substantially match or improve upon the predicted performance of the reference mixture based on one or more optimization objectives.

Figure 4C:
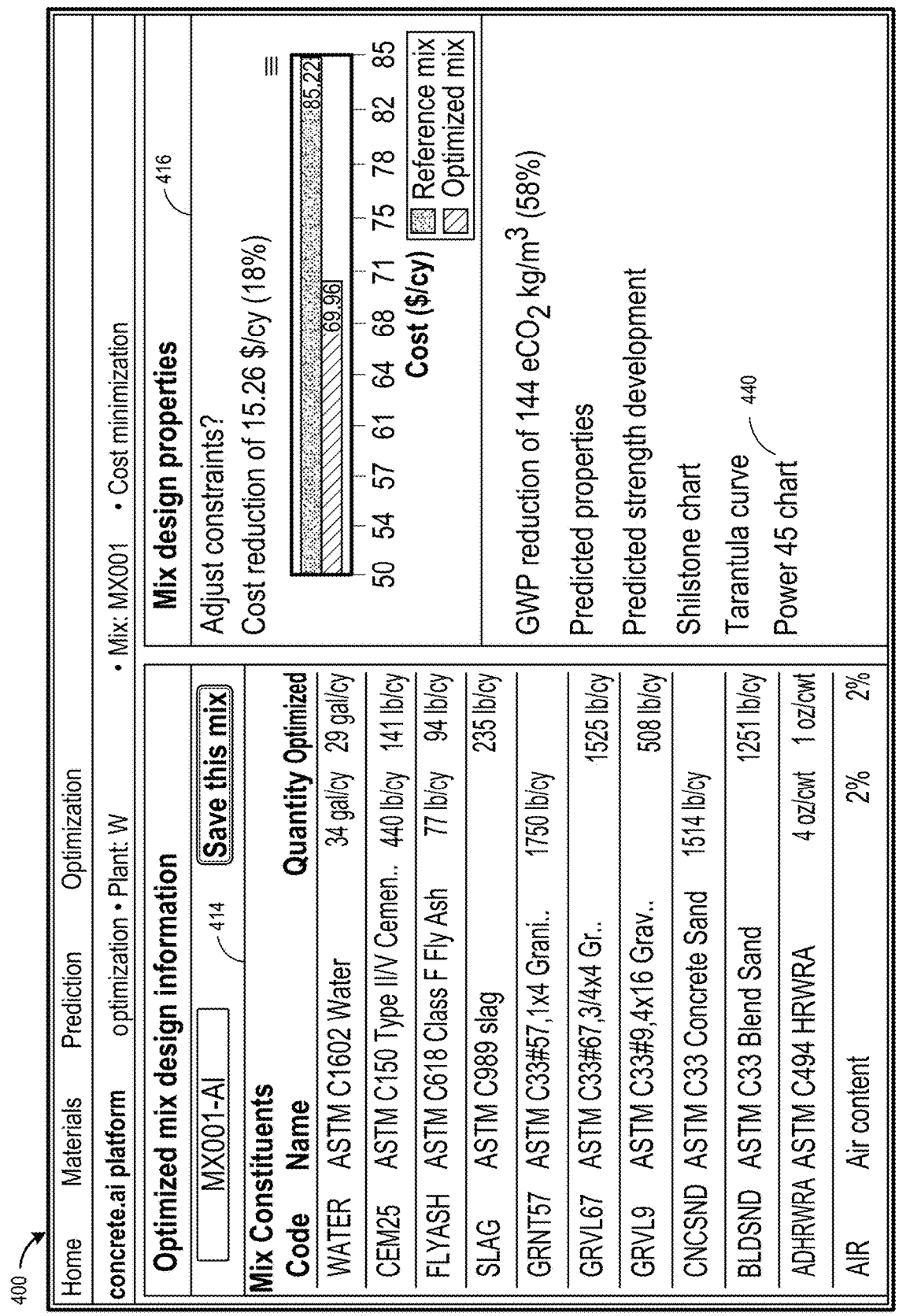

In FIG. 4B, the optimization user interface 400 can include reference mixture information 406 and/or the predicted mixture properties 410. The user can select optimization objective(s) with the optimization objective selector 408. Optimization objectives can include, but are not limited to, minimizing cost, minimizing GWP, or minimizing both cost and GWP. A user can select the optimization selector 412 to cause the artificial intelligence prediction system 104 to optimize the reference mixture. In response to selection of the optimization selector 412, the artificial intelligence prediction system 104 can optimize cementitious materials, aggregate gradation, water content, and/or chemical admixtures and validate the new mixture's performance. As shown, the predicted mixture properties 410 of the reference mixture can include a visualization depicting predicted strength (in PSI) over time. Additional details regarding the predicted mixture properties are described herein, such as with respect to the expanded predicted mixture properties 712 of FIG. 7C. In FIG. 4C, the optimization user interface 400 can present the mixture information 414 and the predicted mixture properties 416 of the generated mixture. The mixture information 414 can include the mixture constituents showing a category, a name, a reference quantity (showing the quantity of a constituent in the reference mixture), and/or a generated quantity (showing a quantity of a constituent in the generated mixture). As shown, the optimization user interface 400 can present visualizations that compare properties of the generated mixture with properties of the reference mixture. As shown, the generated mixture can be predicted to cost less than the reference mixture and the generated mixture can be predicted to emit less carbon dioxide than the reference mixture when produced. As described herein, the optimization user interface 400 can also present visualizations, such as, but not limited to, Shilstone visualizations, tarantula visualizations, and/or Power 45 visualizations that compare the predicted proprieties of the generated mixture and the reference mixture. For example, a user can select the Power 45 visualization selector 440 and be presented with a Power 45 visualization that compares properties of the generated mixture and the reference mixture on a Power 45 visualization. Additional details regarding a Power 45 visualization are described herein, such as with respect to FIG. 7D.

In FIG. 4D, the optimization user interface 400 can include a constraints area 418. A user can change one or more constraints via the user interface elements in the constraints area 418 and select the re-optimize selector 420. In response to selection of the re-optimize selector 420, the artificial intelligence prediction system 104 can re-optimize cementitious materials, aggregate gradation, water content, and/or chemical admixtures and validate the new mixture's performance based at least on the specified. As shown, a user can change one or more of constraints on water, cementitious materials, coarse aggregates, fine aggregates, gradation, chemical admixtures, and/or the number of constituents. Each of the constraints can consist of a threshold that constrains what the artificial intelligence algorithm can prescribe. For example, the user can specify threshold(s) for the water-to-cementitious ratio (such as a minimum and/or maximum water-to-cementitious ratio) and/or threshold(s) for water volume (such as a minimum and/or maximum water volume). In FIG. 4E, the optimization user interface 400 can include an expanded constraints area 422. The expanded constraints area 422 can be similar to the constraints area 418 of FIG. 4D. The expanded constraints area 422 and the constraints area 418 of FIG. 4D can both include input elements. As shown, a user can specify threshold(s) for the total cementitious weight (such as a minimum and/or maximum cementitious weight); threshold(s) for cement weight (such as a minimum and/or maximum cement weight); threshold(s) for total cement replacement material (such as a minimum and/or maximum percentage for total cement replacement material); threshold(s) for a particular cement replacement material (such as a minimum and/or maximum percentage for a particular cement replacement material); and/or threshold(s) for a particular SCM (such as a minimum and/or maximum SCM weight).

Figure 4F:
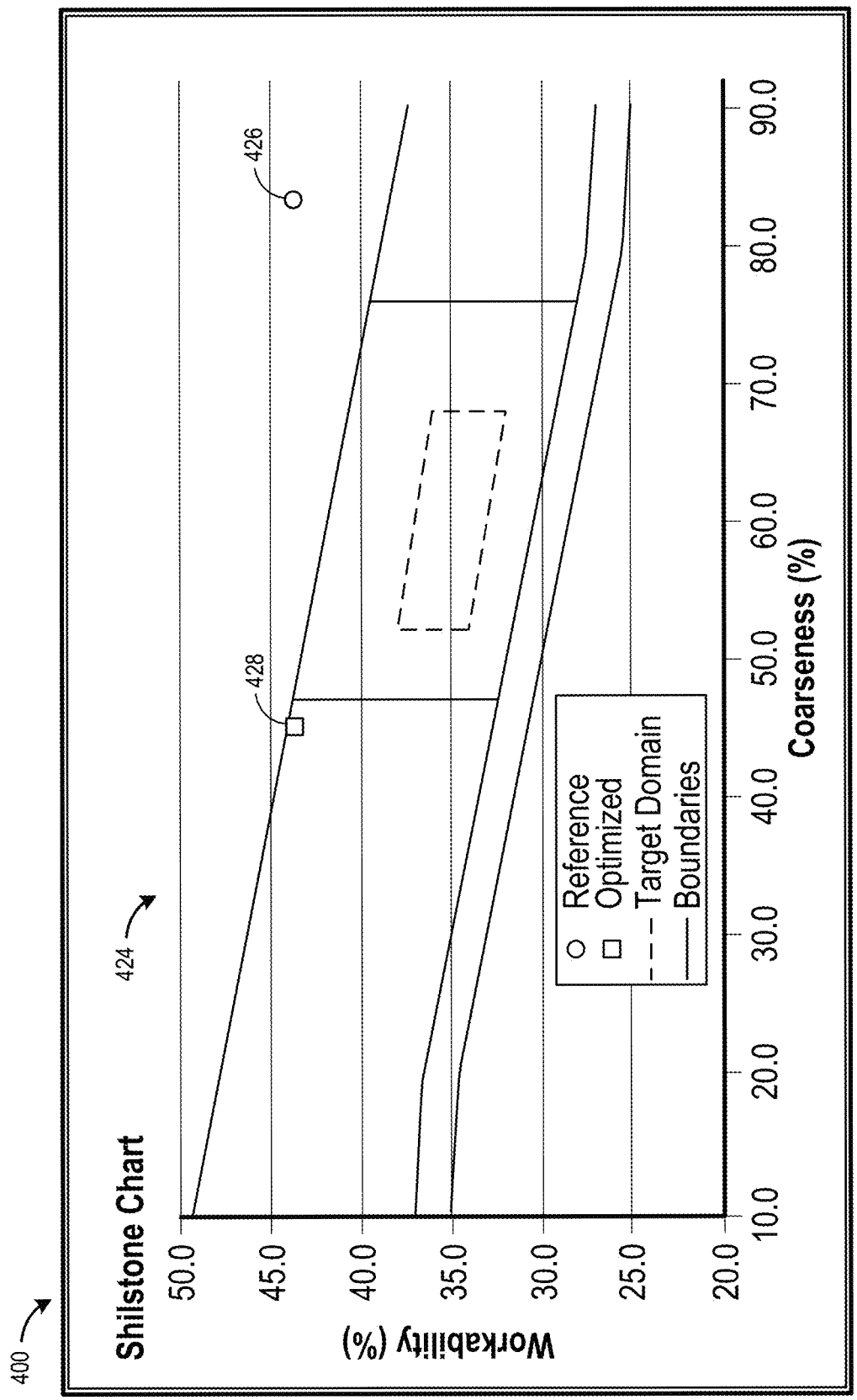

In FIG. 4F, the optimization user interface 400 can include a Shilstone visualization 424. The artificial intelligence prediction system 104 can generate the Shilstone visualization 424, which includes a first indicator 426 for properties of the reference mixture and a second indicator 428 for properties of the generated mixture. The Shilstone visualization 424 can allow a user to compare the reference mixture and the generated mixture. The Shilstone visualization 424 can be generated according to a coarseness chart method based on aggregate proportioning using the combined gradation to proportion a group of sieve sizes that can be categorized as coarse, intermediate, and fine aggregates. The artificial intelligence prediction system 104 can calculate the coarseness and workability factor for the reference and generated mixture based on the following two formulas in Table 1 and plot the results on the visualization 424. As shown, the Shilstone visualization 424 can have boundaries and a target domain for coarseness and workability. Q can be the cumulative percentage retained on the ⅜" sieve. R can be the cumulative percentage retained on the No. 8 sieve. W can be the percentage passing the No. 8 Sieve. C can be the cementitious material content in lb/yd³.

TABLE 1

Coarseness = (Q/R) * 100
Workability = W + (2.5(C − 564)/94)

Figure 4G:
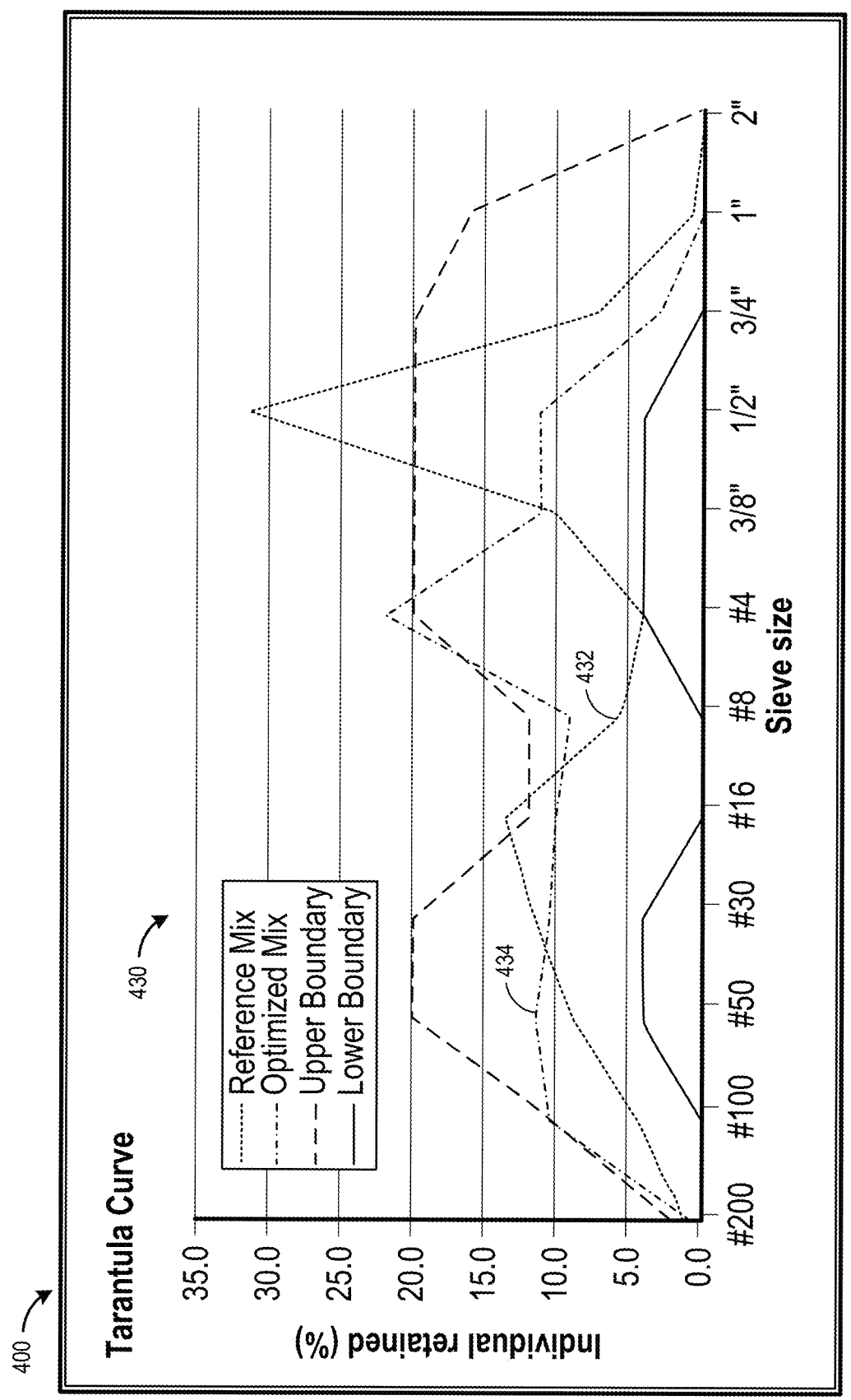

In FIG. 4G, the optimization user interface 400 can include a tarantula visualization 430. The artificial intelligence prediction system 104 can generate the tarantula visualization 430, which includes a first indicator 432 for properties of the reference mixture and a second indicator 434 for properties of the generated mixture. The tarantula visualization 430 can allow a user to compare the reference mixture and the generated mixture. The tarantula visualization 430 can show an expected retention for the reference mixture and generated mixture for each sieve size (No. 200 sieve, No. 100 sieve, No. 50 sieve, No. 30 sieve, No. 16 sieve, No. 8 sieve, No. 4 sieve, ⅜" sieve, ½" sieve, ¾" sieve, 1" sieve, and 2" sieve) on the y axis of the visualization 430. The boundary lines in the tarantula visualization 430 can indicate improved workability and resistance to segregation based on performance testing.

Figure 5A:
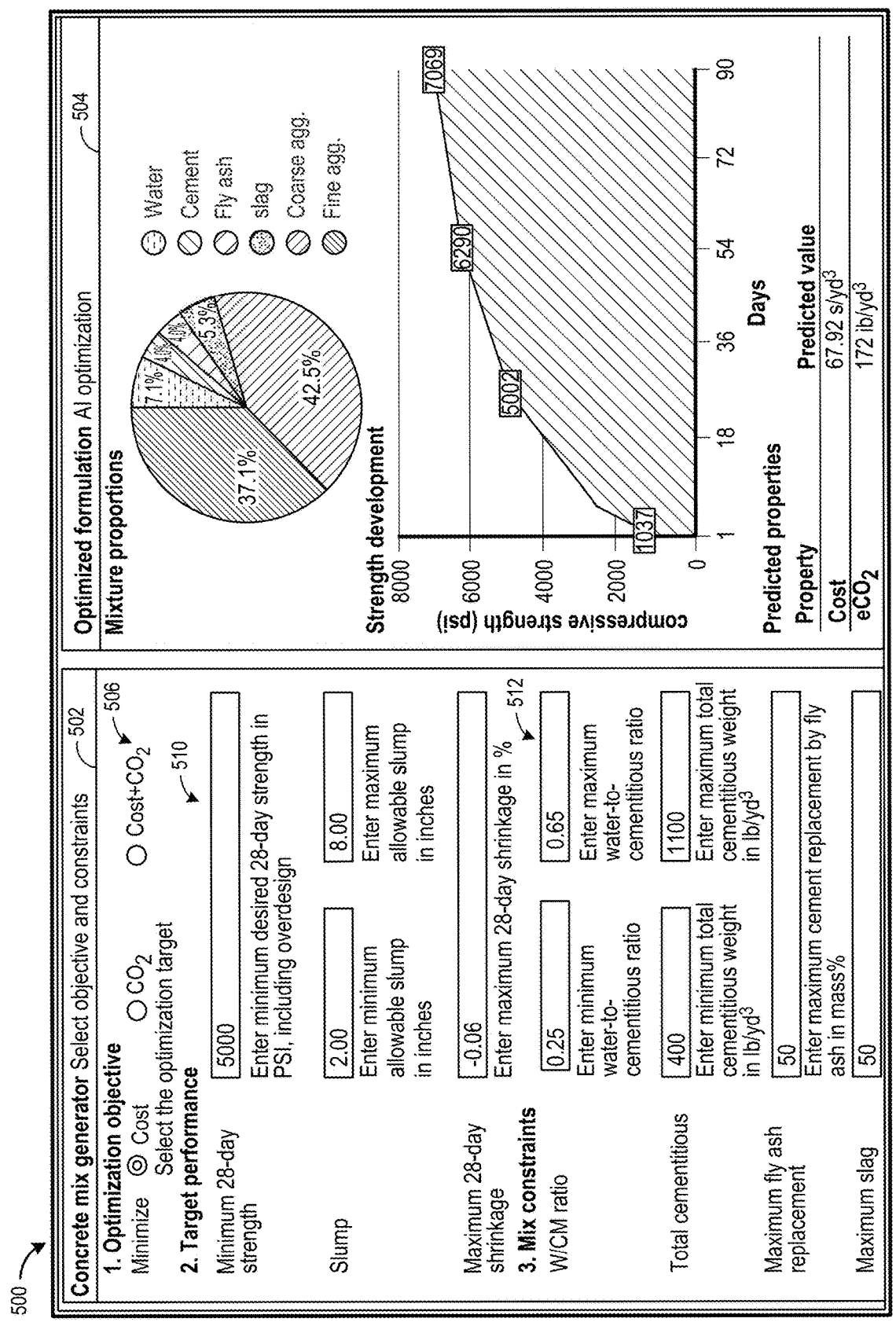
FIGS. 5A-5B depict additional optimization user interfaces of the artificial intelligence prediction system.
Figure 5B:
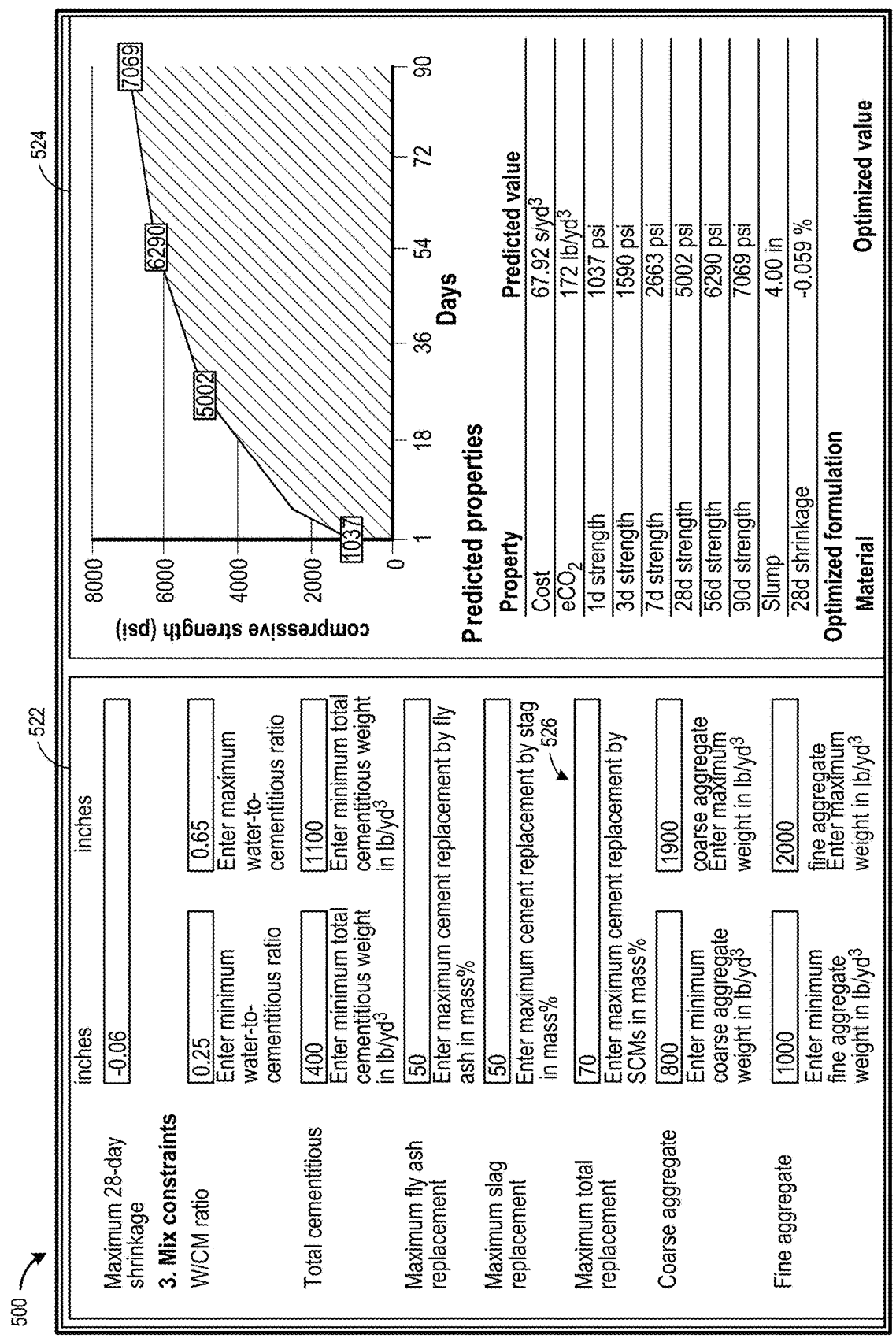

FIGS. 5A-5B depict optimization user interfaces 500 of the artificial intelligence prediction system 104. The optimization user interfaces 500 of FIGS. 5A-5B can be similar to the optimization user interfaces 400 of FIGS. 4A-4G. However, instead of receiving a reference mixture as described herein (such as with respect to FIG. 4A) and the system 104 predicting the performance of the reference mixture, a user can specify the target performance and the system 104 can generate a mixture to satisfy the target performance. In FIG. 5A, the optimization user interface 500 can include an input parameters area 502 and a predictions area 504. Similar to the optimization user interface 400 that can include optimization objective selector 408 of FIG. 4B, the input parameters area 502 can include an optimization objective selector 506. The user can select optimization objective(s) with the optimization objective selector 506. The input parameters area 502 can include target performance input element(s) 510. As shown, the target performance input element(s) 510 can include a strength threshold (such as a minimum 28-day strength pounds per square inch (PSI)), a slump threshold (such as minimum and/or maximum allowable slump in inches), and/or a shrinkage threshold (such as a maximum 28-day shrinkage percentage). The input parameters area 502 can include constraints input element(s) 512. The constraints input element(s) 512 of the input parameters area 502 can be similar to the input element(s) of the constraints area 418 of FIG. 4D and the expanded constraints area 422 of FIG. 4E.

The predictions area 504 can present predicted mixture properties for the generated mixture. The predictions area 504 can also include visualizations related to the predicted mixture properties. The predicted mixture properties in the predictions area 504 can be similar to the predicted mixture properties 410 of FIG. 4B. As shown, the predictions area 504 can include a visualization depicting the mixture proportions, such as, but not limited to, the proportions of water, cement, fly ash, slag, coarse aggregates, and/or fine aggregates.

In FIG. 5B, the optimization user interface 500 can include a continued input parameters area 522 and a continued predictions area 524. The continued input parameters area 522 can include additional constraints input element(s) 526. The additional constraints input element(s) 526 can be similar to the input element(s) of the expanded constraints area 422 of FIG. 4E. As shown, a user can specify threshold (s) for the coarse aggregates (such as a minimum and/or maximum coarse aggregate weight in lb/yd³) and/or threshold(s) for the fine aggregates (such as a minimum and/or maximum fine aggregate weight in lb/yd³).

The continued predictions area 524 can include predicted properties of the generated mixture. Predicted properties can include, but are not limited to, cost, GWP which can also be referred to as $eCO_2$ or equivalent CO2, 1 day strength, 3 day strength, 7 day strength, 28 day strength, 56 day strength, 90 day strength, slump, and/or 28 day shrinkage. While note shown, the continued predictions area 524 can also include mixture information indicating the constituent materials of the generated mixture and a predicted value for each constituent material. The mixture information for the generated mixture in the continued predictions area 524 can be similar to the mixture information 414 of FIG. 4D. However, the mixture information for the generated mixture in the continued predictions area 524 may not have any reference quantities since the optimization user interface 500 may not operate based on a reference mixture unlike the optimization user interfaces 400 of FIGS. 4A-4G.

Figure 6:
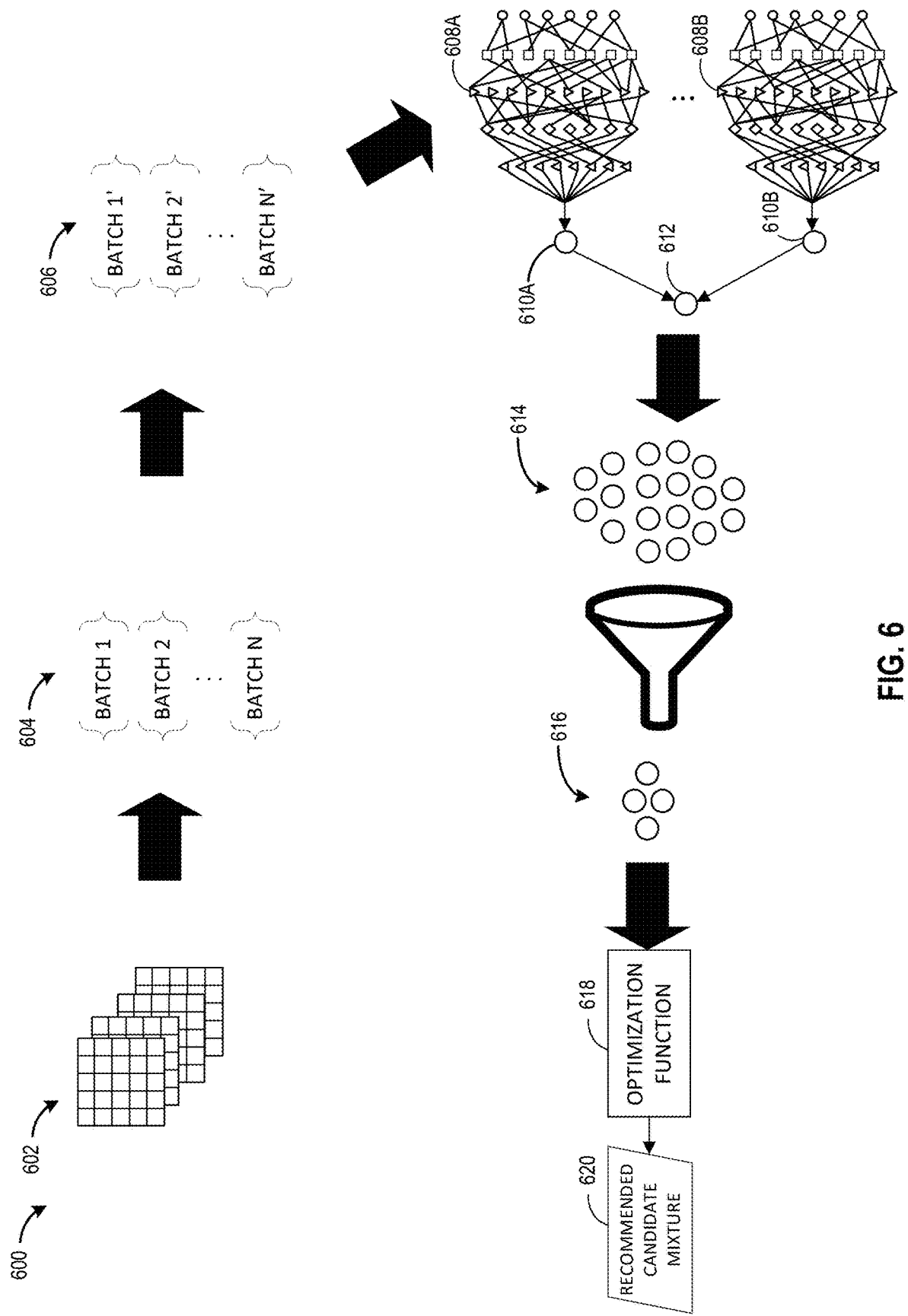
FIG. 6 depicts a process to generate candidate mixtures and recommend a candidate mixture.

FIG. 6 depicts a process 600 to generate candidate concrete mixtures and recommend a candidate concrete mixture. The process 600 can be executed by the artificial intelligence prediction system 104. The process 600 can begin by generating the candidate concrete mixtures via a brute force approach. The candidate concrete mixtures can be represented by the permutation matrix 602. The artificial intelligence prediction system 104 can automatically vary the values of the concrete mixture constituents by a predetermined amount. For example, starting from an initial value, an amount of water can be incremented by a step value (such as half a gallon of water) until an end threshold value is satisfied. The artificial intelligence prediction system 104 can automatically vary the particular constituent material used. For example, the particular type of SCM, coarse aggregate, fine aggregate, etc. In some embodiments, the artificial intelligence prediction system 104 can generate the permutation matrix 602 for a particular organization, plant, or based on some other criteria. For example, each organization can have different materials that they use, which can affect the base set of constituents for the organization. The artificial intelligence prediction system 104 can use data from the materials data storage 116 to generate the permutation matrix 602.

The artificial intelligence prediction system 104 can generate a set of possible values for each concrete mixture constituent, such as, but not limited to, cement, SCM, coarse aggregate, fine aggregate, chemicals, fly ash, and/or slag. In some cases, air as a concrete mixture constituent can be fixed as a specification constraint. The artificial intelligence prediction system 104 can group each permutation of the concrete mixture constituent as a concrete mixture candidate. The number of candidates can be large since the number of candidates can exponentially increase with the number of constituents and/or the number of variations for each constituent. The artificial intelligence prediction system 104 can try all of the generated water values, all of the generated cement values, and so forth. As described herein, in some aspects, this approach can improve over conventional optimization methods, such as conjugate gradient methods, which run the risk of getting stuck into local minima (or maxima or zero) of outputs from the objective function, by allowing exploration of different regions of the permutation matrix where more conventional methods may never reach those regions. Thus, in some aspects, the approaches described herein can result in more accurate recommendations than some conventional approaches.

Due to the large number of candidates, the process 600 can generate multiple batches 604 of candidate concrete mixtures. As described herein, if a candidate concrete mixture has ten to twenty constituents and each constituent has different possible values, then the number of candidate concrete mixtures could be in the hundreds of millions. A naïve approach would be to process as many candidate concrete mixtures in parallel on a computer; however, due to the large number of candidate concrete mixtures and the hardware limitations of many computers, a computer naively processing all of the candidate concrete mixtures could run out of memory. Therefore, the process 600 can generate the multiple batches 604 and each batch can be processed in serial or in parallel by one or more computers to avoid an out of memory issue. The process 600 can also apply any constraints to the batches 604 to result in an updated set of batches 606. As described herein, the constraints can indicate threshold(s) on any one or more of the constituents of a candidate concrete mixture, such as, but not limited to, threshold(s) for the water-to-cementitious ratio (such as a minimum and/or maximum water-to-cementitious ratio) and/or threshold(s) for water volume (such as a minimum and/or maximum water volume). If one or more of the constituents of a candidate concrete mixture do not satisfy the constraints, then the corresponding candidate concrete mixture can be filtered out and excluded from the updated set of batches 606.

The process 600 can make predictions regarding the candidate concrete mixtures from the updated batches from the updated set of batches 606. In some embodiments, the process 600 can generate input data (such as a vector) from particular candidate concrete mixture and provide the input data to two or more trained machine learning models 608A, 608B. The two or more machine learning models 608A, 608B can be trained to output the predictions 610A, 610B described herein (such as, but not limited to, strength, costs, GWP, etc.) and a corresponding confidence interval for each of the predictions 610A, 610B. In some embodiments, a particular machine learning model 608A, 608B can be trained to output multiple predictions for a candidate concrete mixture. The machine learning models 608A, 608B can be trained for a particular organization or plant. The difference between the machine learning models 608A, 608B can be that they were trained based on different hyperparameters and/or different training sets, or using different initial pseudo-random/random seeds. In some embodiments, the process 600 can apply a voting system to select a particular prediction 612. The voting system can be based on the confidence intervals for each of the predictions 610A, 610B. As a result, the process 600 can determine a set of candidate concrete mixtures and corresponding predicted performances 614 (which can include the confidence intervals) for the candidate concrete mixtures.

The process 600 can filter the set of candidate concrete mixtures and corresponding predicted performances 614 based on the predicted performances. Based on the confidence intervals of the candidate concrete mixtures/predicted performances 614, the process 600 can remove candidate concrete mixtures that do not satisfy one or more thresholds. For example, for a particular prediction of a candidate concrete mixture, if there is a threshold for strength of 4000 PSI (which could be a threshold for a particular organization or applied to multiple organizations) and a confidence interval for a predicted strength at 28 days is plus or minus 500 PSI and the predicted strength at 28 days is 4300 PSI, then the process 600 can remove the particular candidate concrete mixture since a predicted strength at the end of the confidence interval below 4000 PSI (4300 PSI minus 500 PSI) may not satisfy the threshold. As a result, the process 600 can determine a subset of candidate concrete mixtures and corresponding predicted performances 616.

The process 600 can apply an optimization function 618 to the subset of candidate concrete mixtures and corresponding predicted performances 616. The process can find the numerical minimums (or maximums or zeros) of the objective function, which can be based on the predicted performance of the candidate concrete mixtures. As described herein, the objective function can be, without limitation, based on cost, GWP, and/or a combination of cost and GWP. Thus, the process 600 can determine a recommended candidate concrete mixture 620.

Figure 7B:
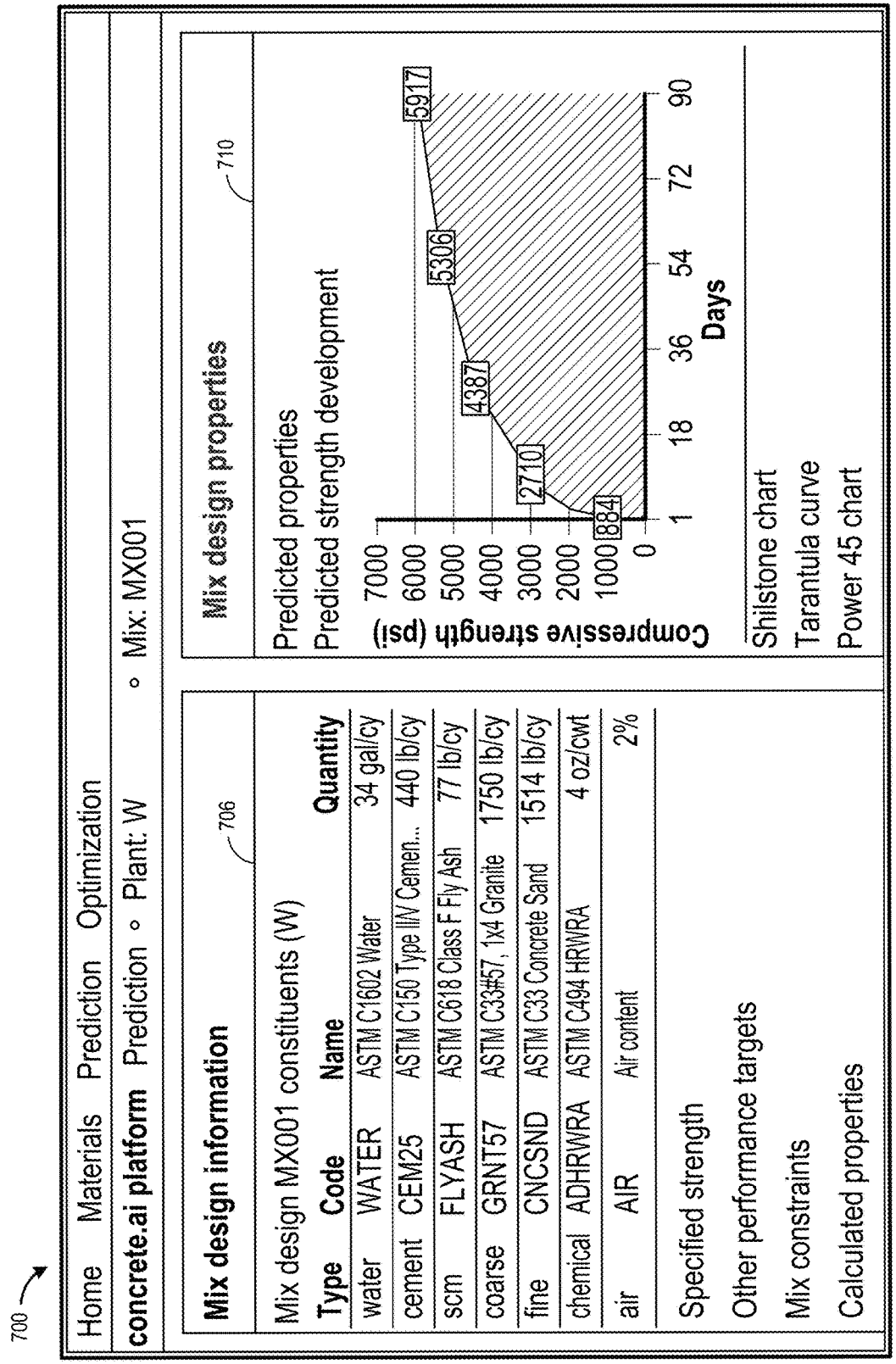

FIGS. 7A-7D depict prediction user interfaces 700 of the artificial intelligence prediction system 104. The prediction user interface 700 of FIG. 7A can be similar to the optimization user interface 400 of FIG. 4A in that both user interfaces can allow a user to select a plant and/or a reference mixture. In FIG. 7A, the prediction user interface 700 can include a plant selector 702, a first mixture selector 704A, and a second mixture selector 704B. A user, with the plant selector 702 and the first mixture selector 704A, can select a specific plant and a specific reference mixture from a list of available at the selected plant. Alternatively, a user, with the plant selector 702 and the second mixture selector 704B, can select a specific plant and a specific reference mixture available at the selected plant via searching for a specific code for the mixture. The artificial intelligence prediction system 104 can predict the performance of the reference mixture using the same prediction methods described herein with respect to optimization.

In FIG. 7B, the prediction user interface 700 can include reference mixture information 706 and/or the predicted mixture properties 710. The prediction user interface 700 of FIG. 7B can be similar to the optimization user interface 400 of FIG. 4B in that both user interfaces provide information regarding the reference mixture and predicted properties of the reference mixture. As shown, the presentation of the reference mixture information 706 can include a type, code, name, and quantity value for each constituent of the reference mixture. As shown, the predicted mixture properties 710 of the reference mixture can include a visualization depicting predicted strength (in PSI) over time.

In FIG. 7C, the prediction user interface 700 can present the reference mixture information 706 and expanded predicted mixture properties 712 of the reference mixture. The expanded predicted mixture properties 712 can indicate properties, predictions regarding the properties, and a confidence interval associated with the predicted properties. As shown, a first predicted property 714 can be for a 1 day strength with a prediction of 884 PSI and ±(plus or minus) 275 PSI. Additional predicted properties can include, but are not limited to, 3 day strength, 7 day strength, 28 day strength, 56 day strength, 90 day strength, 28 day strength/ CM, slump, 28 day shrinkage, setting time, and/or minimum pump line size.

Figure 7D:
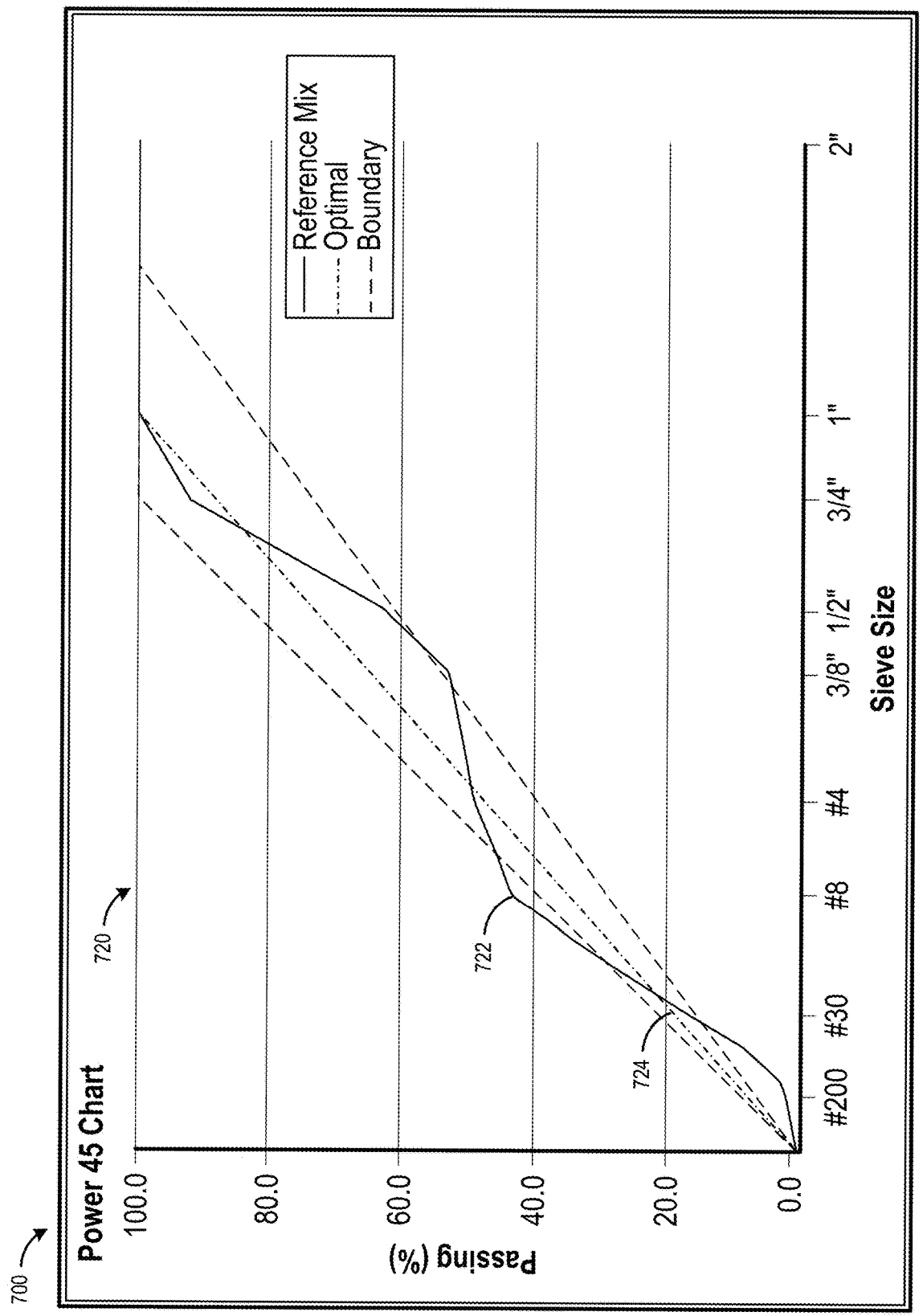

In FIG. 7D, the optimization user interface 400 can include a Power 45 visualization 720. The artificial intelligence prediction system 104 can generate the Power 45 visualization 720, which includes an indicator 722 (which can be referred to as a gradation curve) for properties of the reference mixture. The Power 45 visualization 720 can allow a user to analyze the reference mixture. As shown, the Power 45 visualization 720 has sieve sizes on the x axis and a percent passing on the y axis. In particular, the Power 45 visualization 720 provides a logarithmic range of sieve sizes and shows the percent passing for each sieve size. The closer the gradation curve 722 is to the line 724, the more optimized the gradation according to the Power 45 visualization. In some embodiments, while not illustrated, a similar Power 45 visualization can be generated for a reference mixture and a generated mixture, as described herein, which can allow a comparison between the reference mixture and the generated mixture.

Figure 8A:
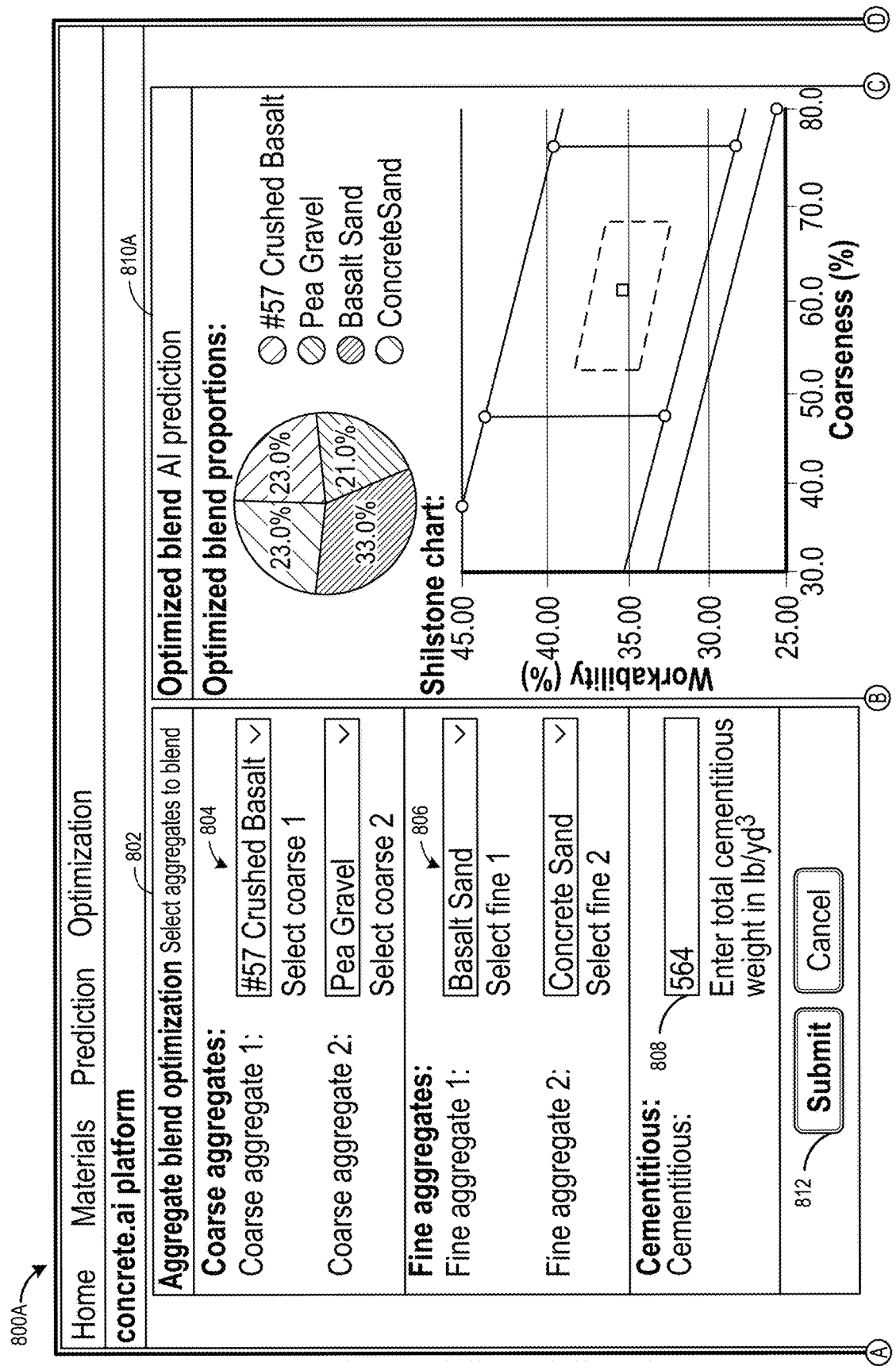
FIGS. 8A-8B depict a gradation optimization user interface of the artificial intelligence prediction system.
Figure 8B:
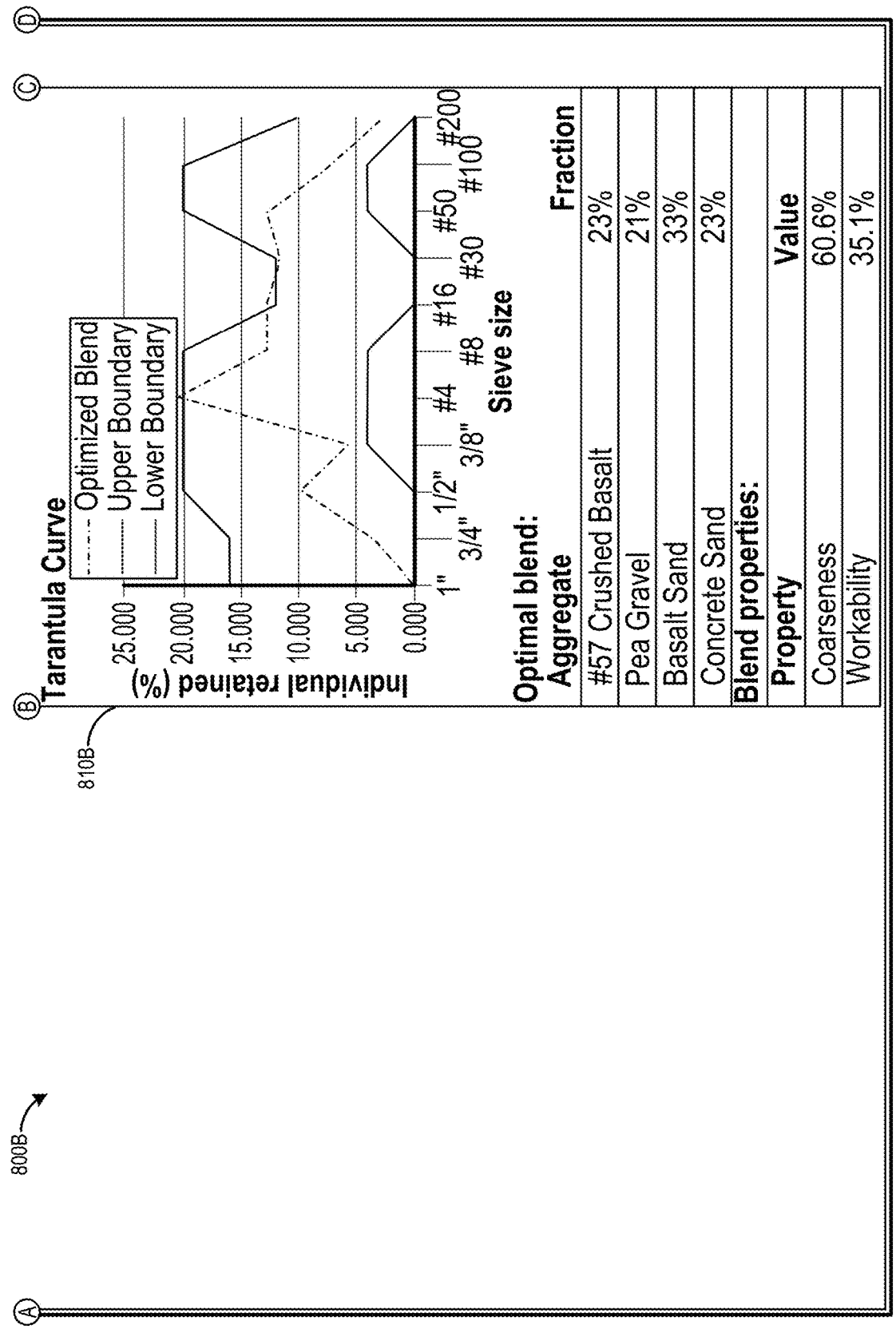

FIGS. 8A-8B depict a gradation optimization user interface 800A, 800B of the artificial intelligence prediction system 104. In FIG. 8A, the gradation optimization user interface 800A can include an input parameters area 802 and a predictions area 810A. The input parameters area 802 can include coarse aggregate input element(s) 804, fine aggregate input element(s) 806, and a cementitious input element 808. As shown, via the input element(s) 804, 806, 808, a user can specify one or more coarse aggregates (here "#57 Crushed Basalt" and "Pea Gravel"), one or more fine aggregates (here "Basalt Sand" and "Concrete Sand"), and/or a cementitious weight (here 564 lb/yd$^3$). A user can select the submit element 812 to cause the predictions area 810A to dynamically update. As described herein, the artificial intelligence prediction system 104 can recommend an aggregate blend based on the provided input. In some embodiments, the artificial intelligence prediction system 104 can process the different combinations of aggregate blends and apply domain knowledge rules to identify an aggregate blend that high strength for a low cost.

The predictions area 810A can present properties for the predicted aggregate blend. The predictions area 810A can also include visualizations related to the predicted aggregate blend. As shown, the predictions area 810A can include a visualization depicting the aggregate blend proportions, such as, but not limited to, a percentage for each of the one or more coarse aggregates and/or fine aggregates. As shown, the predictions area 810A can include a visualization depicting a Shilstone visualization showing the workability and coarseness of the predicted aggregate blend.

In FIG. 8B, the gradation optimization user interface 800B can include a continued predictions area 810B. As shown, the continued predictions area 810B can include a visualization depicting a tarantula visualization showing the workability and coarseness of the predicted aggregate blend. The tarantula visualization can show an expected retention for the predicted aggregate blend for each sieve size (No. 200 sieve, No. 100 sieve, No. 50 sieve, No. 30 sieve, No. 16 sieve, No. 8 sieve, No. 4 sieve, ⅜" sieve, ½" sieve, ¾" sieve, 1" sieve, and 2" sieve) on the y axis of the visualization. As shown, the continued predictions area 810B can also depict numerical values for (i) the fractions for each aggregate in the aggregate blend and/or (ii) expected coarseness and workability for the aggregate blend.

Figure 9:
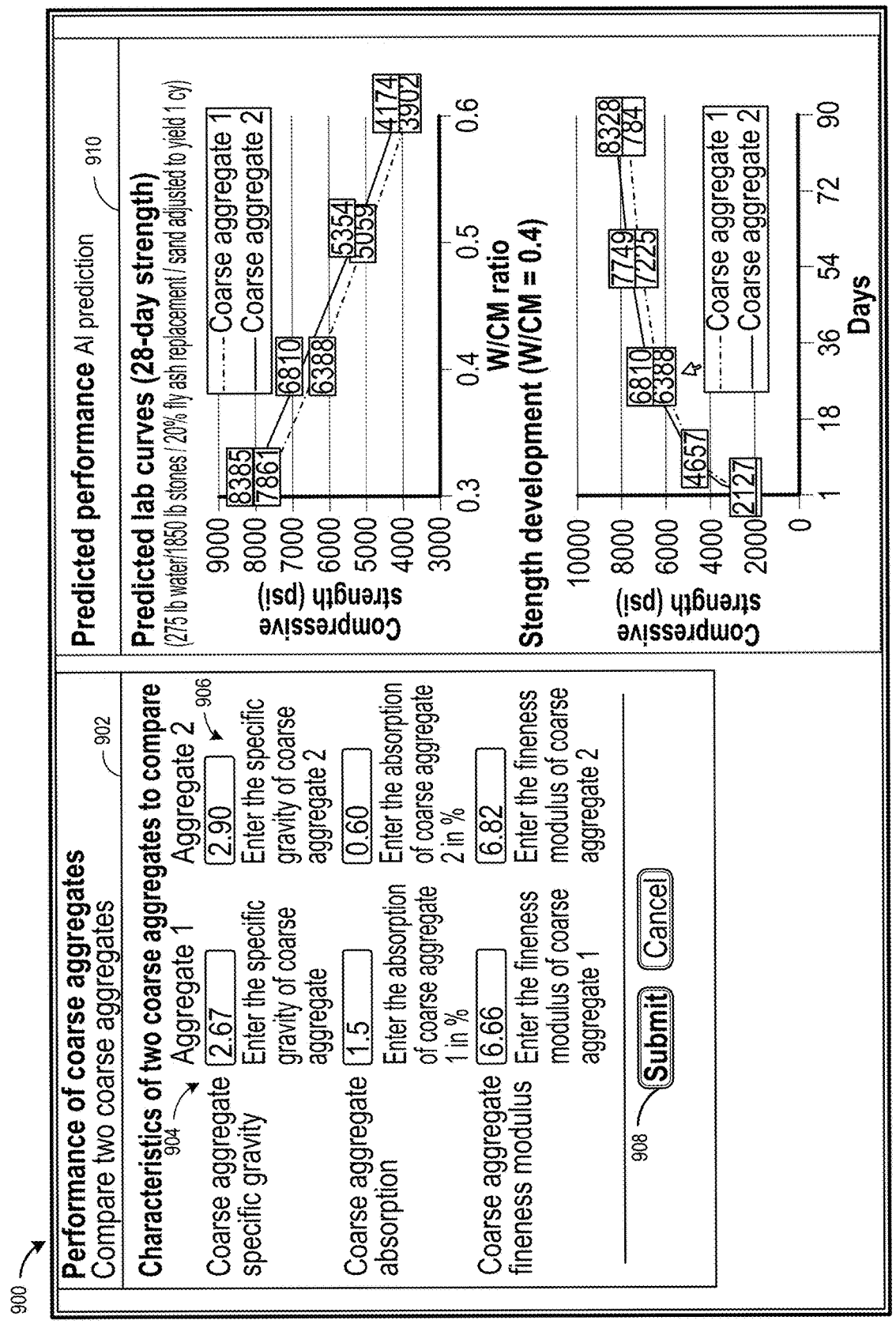
FIG. 9 depicts an aggregate comparison user interface of the artificial intelligence prediction system.

FIG. 9 depicts an aggregate comparison user interface 900 of the artificial intelligence prediction system 104. As described herein, the aggregate comparison user interface 900 can allow a user to compare two aggregates. The artificial intelligence prediction system 104 can generate a first concrete mixture using a first aggregate and a second concrete mixture using a second aggregate, where the only (or substantial) difference between the two mixtures can be the aggregated used. The aggregate comparison user interface 900 can include an input parameters area 902 and a predictions area 910. The input parameters area 902 can include first aggregate input element(s) 804 and second aggregate input element(s) 906. As shown, via the first input element(s) 904, a user can specify characteristics of a first aggregate (such as a coarse aggregate), such as, but not limited to, specific gravity, absorption, and fineness modulus. Similar to the first input element(s) 904, the user can also specify characteristics of a second aggregate via the second aggregate input element(s) 906. A user can select the submit element 908 to cause the predictions area 910 to dynamically update and compare the predicted performances of the first aggregate and the second aggregate in a generated mixture.

The predictions area 910 can present predicted properties for the first and second concrete mixtures using the first and second aggregates, respectively. The predictions area 910 can also include visualizations related to the first and second concrete mixtures. As shown, a visualization can include a depiction of predicted strength (in PSI) over W/CM for the first and second concrete mixtures. W/CM can be the weight of water in the mixture divided by the weight of the cementitious materials that go into the mixture. As shown, a visualization can include a depiction of predicted strength (in PSI) over time for the first and second concrete mixtures. The presented predicted properties of the concrete mixtures in the graphical user interface 900 of FIG. 9 can also be similar to the present predicted properties of the concrete mixture in the graphical user interface 500 of FIG. 5B. For each of the aggregates, the predicted properties can include, but are not limited to, 1 day strength, 3 day strength, 7 day strength, 28 day strength, 56 day strength, 90 day strength, slump, and/or 28 day shrinkage.

Figure 10:
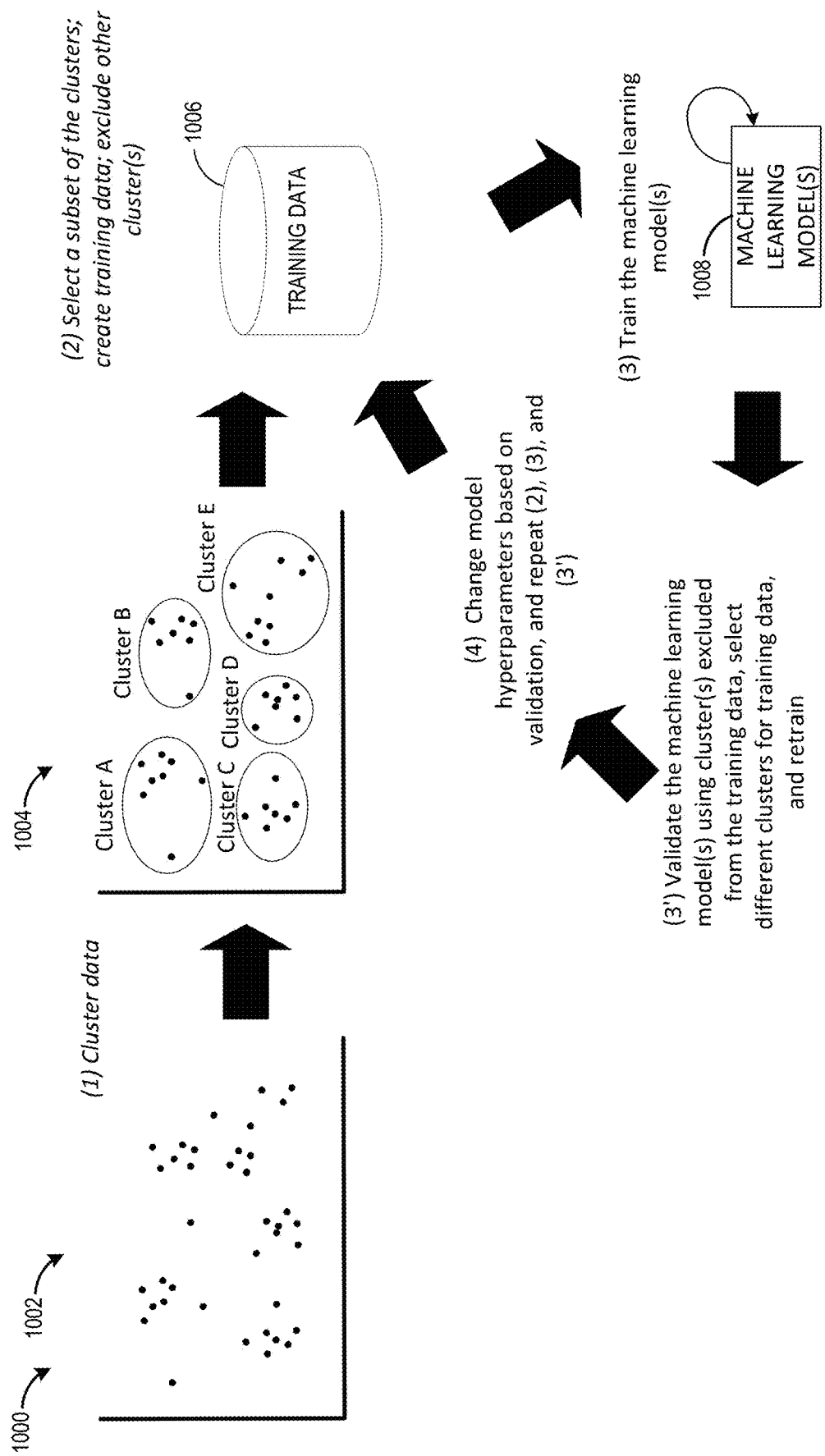
FIG. 10 depicts a process to train and validate one or more machine learning models.

FIG. 10 depicts a process 1000 to train and validate one or more machine learning models. The process 1000 can be executed by the artificial intelligence prediction system 104. The process 1000 can begin at one (1) by clustering the data set 1002 to result in the clusters 1004. The data set 1002 can include multiple data points, where each data point can be a particular concrete mixture represented in several dimensions. In some embodiments, each particular concrete mixture data point can be represented with a vector. The process 1000 can cluster the data set 1002 using Euclidean distances and a clustering algorithm, such as, but not limited to, a K-means clustering algorithm. As shown, the clusters 1004 can include cluster A, cluster B, cluster C, cluster D, and cluster E.

At two (2), the process 1000 select a subset of the clusters 1004 and create a training data set 1006. As described herein, some existing machine learning training procedures randomly select a portion of the data set (such as 80%) to train a machine learning model and the machine learning model can be validated with the remaining portion of the data set (such as 20%). As a result, some existing, trained machine learning models are relatively good at making interpolated predictions as opposed to extrapolated predictions. Accordingly, the process 1000 can instead select a subset of the clusters (such as clusters A, B, C, and D, for example) to create the training data set, thereby excluding one or more clusters (such as cluster E, for example) from the training data set 1006. As described herein, the process 1000 can result in improved machine learning models that can be better than traditional machine learning models at making extrapolated predictions. Extrapolated predictions can be more useful in real world situations where the artificial intelligence prediction system 104 can make predictions for new mixtures that may not fall into an existing cluster and/or the artificial intelligence prediction system 104 may be used to generate a new mixture based on performance targets that may be dissimilar to the performance targets of existing clusters.

At three (3), the process 1000 can train one or more machine learning models 1008 using the training data. The one or more machine learning models 1008 can be initialized using an initial set of hyperparameters, such as, but not limited to, the number of neurons, the number of layers, the number of training epochs, activation functions, optimizer, learning rate, batch size, regularization parameter, etc. The machine learning model(s) 1008 can be trained using backpropagation and supervised and semi-supervised machine learning. At three-prime (3'), the process 1000 can validate the training machine learning model(s) 1008 using one of the excluded clusters (such as cluster E, for example). In particular, the process 1000 can generate input data from a data point in the excluded cluster and provide the input data to the training machine learning model(s) 1008. Since the data point and its cluster was excluded from the training data, the input data can be a good validation test to see how well the model(s) 1008 perform at making an extrapolated prediction. The process 1000 can further include selecting a different subset of clusters (such as clusters B, C, D, and E, for example) as the updated training data and excluding a different one or more other clusters (such as cluster A, for example) from the updated training data. Thus, the process 1000 can repeat three (3) and three-prime (3') to retrain the machine learning model(s) and recalculate an accuracy value until some threshold is satisfied. As described herein, the process 1000 can systematically select a different subset of clusters on additional iterations and the accuracy value can be updated such that the end result of the process 1000 may not depend on the arbitrary choice of which subset is selected. At four (4), the process 1000 can include changing the hyperparameters of machine learning models based on the validation results. For example, if the previously trained machine learning models 1008 did not perform well at making predictions using data points from an excluded cluster, then a data analyst and/or the system 104 can change the hyperparameters, such as, but not limited to, the number of neurons, the number of layers, the number of training epochs, etc. Moreover, the process 1000 can repeat (2), (3), and (3') until the accuracy of the machine learning model(s) meets a threshold.

Figure 11:
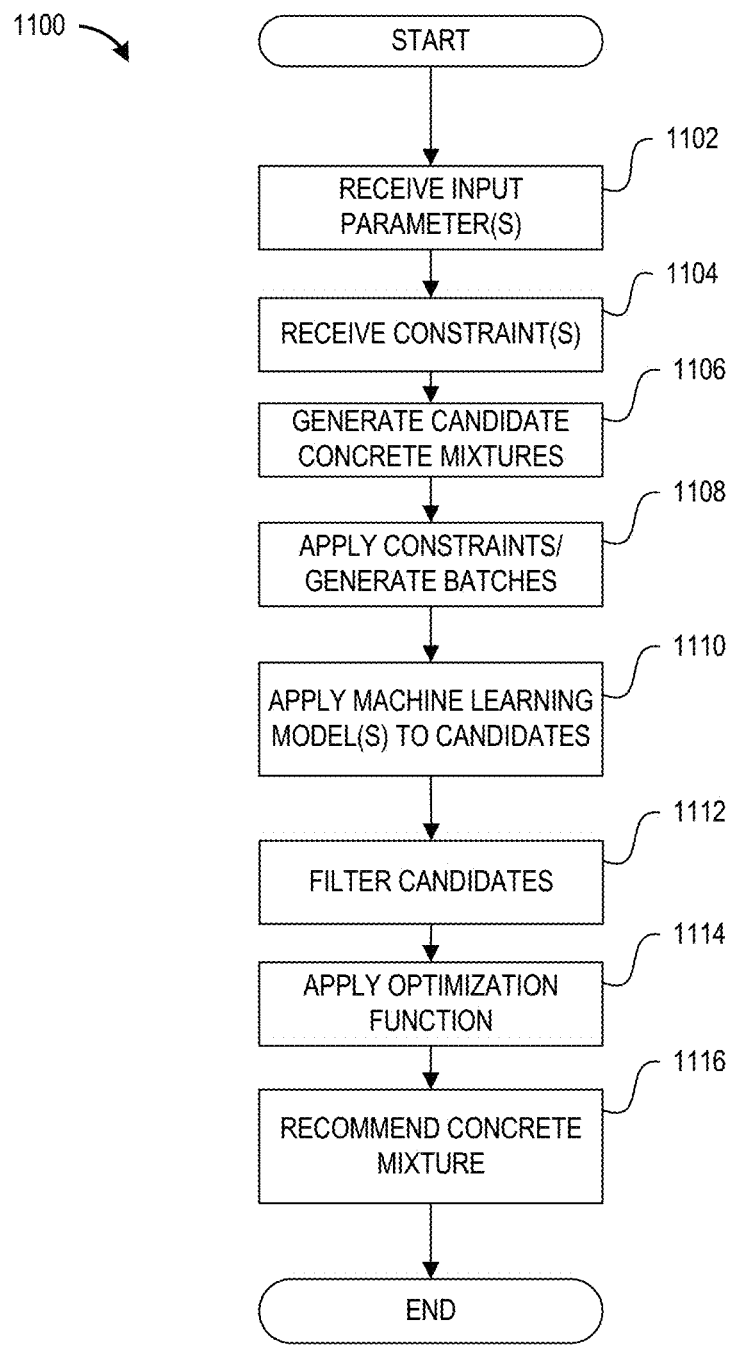
FIG. 11 is a flow chart depicting a method for artificial intelligence concrete-related predictions.

FIG. 11 is a flow chart depicting a method 1100 implemented by the artificial intelligence prediction system 104 for concrete-related predictions. Some aspects of the method 1100 may be implemented by components of the artificial intelligence prediction system 104, such as the ingestion server(s) 150, the training server(s) 130, the prediction server(s) 110, and/or the user interface server 120.

Beginning at block 1102, input parameter(s) can be received. The artificial intelligence prediction system 104 can receive one or more input parameters related to generating a artificial intelligence concrete mixture. The one or more input parameters can be received via a graphical user interface of the artificial intelligence prediction system 104.

In some embodiments, an input parameter can include a reference concrete mixture. Additional details regarding receiving a reference concrete mixture are described herein, such as with respect to FIG. 4A. As described herein, the target performance(s) for the artificial intelligence concrete mixture can be determined based on the predicted performance of the reference concrete mixture. An input parameter can include an objective, such as, but not limited to, a cost objective, a global warming potential objective, or a cost and global warming potential objective. In some embodiments, the input parameters can include an organization and/or a particular plant.

In some embodiments, the artificial intelligence prediction system 104 can receive an input parameter that includes a target performance parameter, such as a target performance threshold. Target performance parameters can include, but are not limited to, a strength threshold (such as minimum 28 day strength), a slump threshold (such as minimum and/or maximum allowable slump), and/or a shrinkage threshold (such as a maximum 28 day shrinkage). As described herein, the target performance parameters can be received via a graphical user interface. Additional details regarding receiving target performance parameters are described herein, such as with respect to FIG. 5A.

At block 1104, one or more constraints can be received. The artificial intelligence prediction system 104 can receive one or more constraints on the artificial intelligence concrete mixture. A constraint can include a threshold on a concrete mixture constituent. Constraints, can include, but are not limited to, thresholds on one or more of water, cementitious materials, coarse aggregates, fine aggregates, gradation, chemical admixtures, and/or the number of constituents. In particular, constraints can include, but are not limited to, threshold(s) for the water-to-cementitious ratio (such as a minimum and/or maximum water-to-cementitious ratio); threshold(s) for water volume (such as a minimum and/or maximum water volume); threshold(s) for the total cementitious weight (such as a minimum and/or maximum cementitious weight); threshold(s) for cement weight (such as a minimum and/or maximum cement weight); threshold(s) for total cement replacement material (such as a minimum and/or maximum percentage for total cement replacement material); threshold(s) for a particular cement replacement material (such as a minimum and/or maximum percentage for a particular cement replacement material); threshold(s) for a particular SCM (such as a minimum and/or maximum SCM weight); threshold(s) for the coarse aggregates (such as a minimum and/or maximum coarse aggregate weight and/or threshold(s) for the fine aggregates (such as a minimum and/or maximum fine aggregate weight). The constraints can be received via a graphical user interface of the artificial intelligence prediction system 104. Additional details regarding receiving constraints are described herein, such as with respect to FIGS. 4D, 4E, 5A, 5B.

In some embodiments, allowing a user to specify constraints such as a minimum of a certain aggregate can be helpful for supply chain issues. For example, if a producer has certain aggregates in their supply the producer wants to use, the user can specify a minimum for that aggregate in the generated concrete mixture. Accordingly, the artificial intelligence prediction system 104 can generate a concrete mixture that advantageously uses up the producer's supply.

Additionally or alternatively, the artificial intelligence prediction system 104 can have access to the materials supply of a particular organization. Thus, the artificial intelligence prediction system 104 can prioritize using particular materials (such as by automatically setting material constraints) that satisfy a prioritization threshold. For example, if a particular aggregate is above a threshold amount in supply, the artificial intelligence prediction system 104 can set a minimum amount of the aggregate as a constraint as part of the mixture generation process.

At block 1106, candidate concrete mixtures can be generated. The prediction server 110 can generate the candidate concrete mixtures. The prediction server 110 can receive the possible constituents that can be used in a candidate concrete mixture. As described herein, the materials can be specific to materials that are available to a particular organization and/or plant. The prediction server 110 can generate a permutation matrix for the possible constituents and vary each possible value starting from an initial value, increasing by a step value, until a threshold value is satisfied. As described herein, the concrete mixture constituents, can include, but is not limited to, particular cement(s), particular SCM(s) (such as particular fly ash or slag), particular coarse aggregate(s), particular fine aggregate(s), particular chemical(s), and/or air. The prediction server 110 can use the permutation matrix to determine the various combinations of possibilities for candidate concrete mixtures. As described herein, if a candidate concrete mixture has ten to twenty constituents and each constituent has different possible values, then the number of candidate concrete mixtures could be in the hundreds of millions. Additional details regarding generating candidate concrete mixtures are described herein, such as with respect to FIG. 6.

The prediction server 110 can generate the candidate concrete mixtures in the following manner. The prediction server 110 can create a first candidate concrete mixture with multiple concrete mixture constituents. The prediction server 110 can assign a first value (such as a start value) for a first concrete mixture constituent in the first candidate concrete mixture. The prediction server 110 can add the first candidate concrete mixture to the set of candidate concrete mixtures for later processing. The prediction server 110 can combine the first value and a step value to result in a second value. The prediction server 110 can create a second candidate concrete mixture with concrete mixture constituents. The prediction server 110 can assign the second value for the concrete mixture constituent in the second candidate concrete mixture. The prediction server 110 can add the second candidate concrete mixture to the set of candidate concrete mixtures for later processing. The prediction server 110 can continue changing values for multiple permutations of the candidate concrete mixtures until thresholds are met.

In some embodiments, the prediction server 110 can apply domain knowledge rules while generating the candidate concrete mixtures. The prediction server 110 can create a candidate concrete mixture with multiple concrete mixture constituents. The prediction server 110 can determine a value associated with the candidate concrete mixture, such as, but not limited, to an amount of a particular constituent or a value based on the amounts of particular constituents (such as a coarseness factor value and/or a workability factor value). The prediction server 110 can determine that the value associated with the candidate concrete mixture satisfies or fails to satisfy a domain threshold. As described herein, the domain threshold can be related to knowledge associated with a Shilstone visualization, a tarantula visualization, and/or a Power 45 visualization. The prediction server 110 can determine whether to include or exclude the candidate concrete mixture based on whether the value satisfies or fails to satisfy the threshold.

At block 1108, one or more constraints can be applied. The prediction server 110 can apply one or more constraints to the generated candidate concrete mixtures. The prediction server 110 can identify a subset of candidate concrete mixtures from the generated candidate concrete mixtures. The prediction server 110 can determine, from a constraint, that a candidate concrete mixture satisfies a threshold on the concrete mixture constituent. In some embodiments, the constraints can be applied before or after batches are generated.

One or more batches can be generated. The prediction server 110 can generate multiple batches from the candidate concrete mixtures. As described herein, in some embodiments, some computers naively processing all of the candidate concrete mixtures would run out of memory. Therefore, the prediction server 110 can group candidate mixtures together for batch processing to avoid the out of memory and/or other hardware issue. The prediction server 110 can use a configurable value to determine how many batches should be generated from the set of candidate concrete mixtures and/or how many candidate concrete mixtures should be added to each batch.

At block 1110, one or more machine learning models can be applied to candidates. The prediction server 110 can generate input data for a particular candidate concrete mixture. The prediction server 110 can invoke a machine learning model, where the machine learning model receives the input data as input, and where the machine learning model outputs a prediction based on the input data. As described herein, the prediction server 110 can process the candidate concrete mixtures in batches. The prediction server 110 can, for each candidate concrete mixture, process the candidate concrete mixture by using the machine learning model(s) on the candidate concrete mixture. As described herein, the machine learning model(s) to be applied to candidates can be customized for particular organizations and/or plants.

The prediction server 110 can generate input data based on one or more features from a particular candidate concrete mixture. Features can include, but are not limited to, a feature corresponding to a water-to-cementitious material ratio for the particular candidate concrete mixture, a feature corresponding to an aggregate density value for the particular candidate concrete mixture, a feature corresponding to an aggregate water absorption value for the particular candidate concrete mixture, a feature corresponding to an aggregate fineness modulus value for the particular candidate concrete mixture, and/or an amount of a concrete mixture constituent in the particular candidate concrete mixture. A specific set of features could include water and a quantity of water, a particular cement and a quantity of the cement, a particular fly ash and a quantity of the fly ash, a particular coarse aggregate and a quantity of the coarse aggregate, a particular fine aggregate and a quantity of the fine aggregate, a particular chemical and a quantity of the chemical, and/or air and an amount of air. Depending on the embodiment, features that include the particular concrete mixture constituents and respective amounts can further include or exclude the feature corresponding to a water-to-cementitious material ratio for the particular candidate concrete mixture, the feature corresponding to an aggregate density value for the particular candidate concrete mixture, the feature corresponding to an aggregate water absorption value for the particular candidate concrete mixture, and/or the feature corresponding to an aggregate fineness modulus value for the particular candidate concrete mixture. The prediction server 110 can convert the features into vector data and the input data to the machine learning model(s) can include the vector data.

In some embodiments, a single machine learning model can support multiple outputs directly. The output predictions of the machine learning model(s) can include, but are not limited to, 1 day strength, 3 day strength, 7 day strength, 28 day strength, 56 day strength, 90 day strength, slump, and/or 28 day shrinkage. As described herein, multiple machine learning models can be used on the same particular candidate concrete mixture, which can result in predictions from each machine learning model. The prediction server 110 can generate a confidence interval based on the multiple predictions. A confidence interval can be the sample mean plus or minus the margin of error. In some embodiments, a confidence interval can be calculated with the formula in Table 2 below. In the below formula, X can be the sample mean; t can be the t-score value; S can be the sample standard deviation; and N can be the sample size.

TABLE 2

$$\text{Confidence Interval} = X \pm t \frac{S}{\sqrt{N}}$$

In the equation in Table 2, the standard deviation may decrease as the size of the dataset increases, which may reduce the range of the confidence interval (i.e., increase the degree of confidence of the prediction). Collecting more data points may allow the artificial intelligence prediction system 104 to decrease the value of the t-factor (such as by decreasing the confidence level from 99.9% down to 99% and then 95%), which, again, may reduce the range of the confidence interval. In turn, reducing the range of the confidence interval may allow the artificial intelligence prediction system 104 to make the optimization less conservative and increase cost savings and/or GWP savings. In other words, the artificial intelligence prediction system 104 may achieve "continuous improvement" such that the potential savings can increase over time as more data gets ingested.

In some embodiments, where multiple machine learning models are used for a particular concrete mixture, the prediction server 110 can determine a predicted output (or multiple predicted outputs) based on the output(s) from each of the multiple machine learning models. The prediction server 110 can use a regression voting ensemble with the multiple machine learning models. In some embodiments, the prediction server 110 can apply a statistical measure, such as a median or an average, to determine the predicted output. In other words, a final prediction output can be the statistical measure (such as a median or an average) of the output from the contributing models. Additional details regarding applying machine learning models are described herein, such as with respect to FIG. 6.

With respect to using multiple machine learning models, the prediction server 110 can generate input data for the candidate concrete mixture. The prediction server 110 can, for each particular machine learning model from a multiple machine learning models, invoke the particular machine learning model, where the particular machine learning model receives the input data as input. The prediction server 110 can apply a statistical measure (such as a median or an average) to output from each particular machine learning model from the multiple machine learning models. The application statistical measure can output the prediction (such as by using the median value as the prediction). The prediction server 110 can calculate a confidence interval from the output from each particular machine learning model from the multiple machine learning models.

At block 1112, the candidate concrete mixtures can be filtered. The prediction server 110 can filter the candidate concrete mixtures that were applied to the machine learning model(s). The prediction server 110 can identify, from the subset of candidate concrete mixtures, a filtered set of candidate concrete mixtures. The prediction server 110 can determine that a particular prediction for the particular candidate concrete mixture fails to satisfy a target performance threshold based on the one or more input parameters. As described herein, the one or more input parameters can include performance targets, such as, but not limited to, a strength threshold (such as minimum 28 day strength), a slump threshold (such as minimum and/or maximum allowable slump), and/or a shrinkage threshold (such as a maximum 28 day shrinkage). As a result, the filtered set of candidate concrete mixtures can include multiple candidate concrete mixtures (such as a first candidate concrete mixture and a second candidate concrete mixture) that can each be associated with a predicted cost and/or GWP. In some embodiments, such as where confidence intervals are determined, the prediction server 110 can determine that a prediction combined with the confidence interval satisfies (or fails to satisfy) the target performance threshold. Thus, the artificial intelligence prediction system 104 can incorporate error range into prediction to ensure that the optimization meets specified performance requirement(s). Accordingly, the low end of the confidence can conform with design requirements and the confidence can improve over time, thereby reducing risk while reducing cost. Additional details regarding filtering the candidates are described herein, such as with respect to FIG. 6.

Additionally or alternatively, if the input parameters included a reference concrete mixture, then the prediction server 110 can apply the machine learning model(s) from the previous block 1110 to the reference concrete mixture to predict the performance of the reference concrete mixture. The prediction server 110 can generate reference input data for the reference concrete mixture. The prediction server 110 can invoke the machine learning model(s), which receive the reference input data as input. The machine learning model(s) can output a reference prediction based on the reference input data. The target performance threshold can be based on the reference prediction. The prediction server 110 can determine that a particular prediction for the particular candidate concrete mixture fails to satisfy a target performance threshold specified by the predicted performance of the reference concrete mixture.

The prediction server 110 can calculate a cost and/or GWP for each candidate concrete mixture (which can be the remaining candidate concrete mixtures after filtering). The prediction server 110 can calculate the predicted cost based on the costs for each concrete mixture constituent in the materials data storage 116. The prediction server 110 can combine the individual costs and respective quantities for each constituent to determine a total predicted cost. Similarly, the prediction server 110 can calculate the predicted GWP based on the GWP for each concrete mixture constituent in the materials data storage 116. The prediction server 110 can combine the individual GWP and respective quantities for each constituent to determine a total predicted GWP.

At block 1114, an optimization function can be applied. The prediction server 110 can apply an optimization function to the filtered candidates. The optimization function can select a first candidate concrete mixture over a second candidate concrete mixture. As described herein, the prediction server 110 can apply one or more objectives, such as, but not limited to, cost and/or GWP. If the objective is to minimize cost, the optimization function can select the candidate concrete mixture with the lowest predicted cost. If the objective is to minimize GWP, the optimization function can select the candidate concrete mixture with the lowest predicted GWP. If the objective is to minimize cost and GWP, the optimization function can select the candidate concrete mixture with the lowest predicted cost and the lowest predicted GWP. In some embodiments, the optimization function can apply weights to the predicted properties (such as cost and GWP), combine the predicted properties into a predicted score, and select the candidate concrete mixture with the best combined score out of the remaining candidates.

At block 1116, a concrete mixture can be recommended. The prediction server 110 can receive the selected candidate concrete mixture from the optimization function and provide the selected concrete mixture as a recommendation. As described herein, the artificial intelligence prediction system 104 can present the recommendation in a graphical user interface. Additional details regarding providing an artificial intelligence concrete mixture are described herein, such as with respect to FIGS. 4C, 5A.

In some embodiments, one or more visualizations (such as, but not limited to, a Shilstone visualization, a tarantula visualization, and/or a Power 45 visualization) can be presented in the graphical user interface with the recommendation. The prediction server 110 can calculate a coarseness factor value and a workability factor value for the artificial intelligence concrete mixture. The user interface server 120 can present, in the graphical user interface, a Shilstone visualization. The Shilstone visualization can include a point representing the coarseness factor value and the workability factor value. Additional details regarding Shilstone visualizations are described herein, such as with respect to FIG. 4F.

The user interface server 120 can present a tarantula visualization. The prediction server 110 can determine an expected retention value for the artificial intelligence concrete mixture for a particular sieve size. The prediction server 110 can determine the individual fraction retained at a given sieve N as equal to the total fraction of the aggregates passing at sieve N−1, minus the total fraction of the aggregates passing at sieve N. The user interface server 120 can present, in the graphical user interface, a tarantula visualization that includes a point representing the expected retention value for the particular sieve size. Additional details regarding tarantula visualizations are described herein, such as with respect to FIG. 4G.

In some embodiments, if the input parameters included a reference concrete mixture, then the user interface server 120 can present visualizations including both the reference concrete mixture and the artificial intelligence concrete mixture. The prediction server 110 can calculate a first performance metric associated with the first candidate concrete mixture (such as any of the metrics associated with a Shilstone visualization, a tarantula visualization, and/or a Power 45 visualization). The prediction server 110 can calculate a second performance metric associated with the second candidate concrete mixture. The user interface server 120 can cause presentation, in the graphical user interface, of a visualization that includes the first performance metric and the second performance metric mixture (such as, but not limited to, a Shilstone visualization, a tarantula visualization, and/or a Power 45 visualization).

Figure 12:
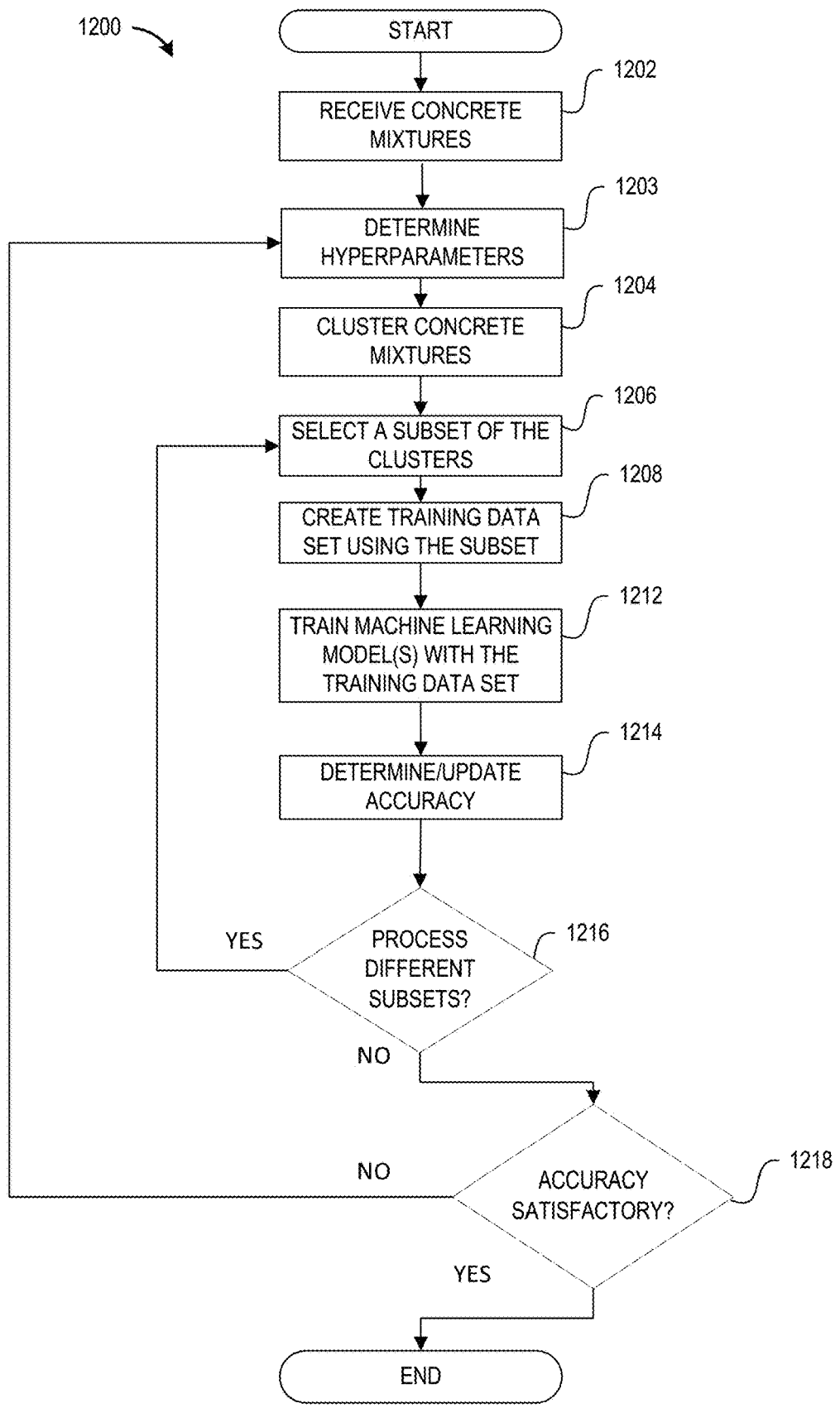
FIG. 12 is a flow chart depicting a method for training and validating machine learning models for concrete-related predictions.

FIG. 12 is a flow chart depicting a method 1200 implemented by the artificial intelligence prediction system 104 for training and validating machine learning models for concrete-related predictions. Some aspects of the method 1200 may be implemented by components of the artificial intelligence prediction system 104, such as the ingestion server(s) 150 and/or the training server(s) 130.

Beginning at block 1202, concrete mixtures can be received. The ingestion server 150 can receive concrete mixtures. Each concrete mixture can consist of a concrete mixture constituent and a value associated with the constituent. As described herein, the concrete mixture constituents, can include, but are not limited to, particular cement(s), particular SCM(s) (such as particular fly ash or slag), particular coarse aggregate(s), particular fine aggregate(s), particular chemical(s), and/or air. In some embodiments, a set of concrete mixtures can be associated with a particular organization or plant. The ingestion server 150 can receive metadata associated with the concrete mixtures, such as, but not limited to, the actual performance metrics of the mixture, cost of the mixture, and/or cost of each constituent of the mixture. The performance metrics for a mixture can include, but are not limited to, GWP, 1 day strength, 3 day strength, 7 day strength, 28 day strength, 56 day strength, 90 day strength, slump, and/or 28 day shrinkage.

At block 1203, hyperparameters can be determined. The training server 130 can determine a set of hyperparameters. The training server 130 can use a permutation matrix to select particular combination(s) of hyperparameters. Additionally or alternatively, a data analyst can manually select the hyperparameters. As described herein, hyperparameters, can include, but are not limited to, the number of neurons, the number of layers, the number of training epochs, activation functions, optimizer, learning rate, regularization parameter, and/or batch size. In some embodiments, where multiple machine learning models can be used together to make a prediction, the hyperparameters for multiple machine learning models can be determined. The multiple machine learning models can each have at least one different hyperparameter.

At block 1204, the concrete mixtures can be clustered. The training server 130 can cluster the concrete mixtures. The training server 130 can generate clusters from the concrete mixtures. The training server 130 can use a clustering algorithm, such as a K-means clustering algorithm, to generate the clusters. The training server 130 can convert each concrete mixture into an n-dimensional vector. Each concrete mixture can be associated with a data point in an n-dimensional space. The training server 130 can apply a K-means clustering, which can include: (0) determine a number of clusters; (1) randomly or pseudo-randomly select centroids (center of cluster) for each cluster; (2) calculate a Euclidean distance of all data points to the centroids; (3) assign data points to the closest cluster; (4) find the new centroids of each cluster by taking the mean of all data points in the cluster; and (5) repeat (2), (3), and (4) until cluster center movement satisfies some threshold, i.e., stop moving. Additional details regarding clustering concrete mixtures are described herein, such as with respect to FIG. 10.

At block 1206, a subset of the clusters can be selected. The training server 130 can select a subset of clusters, where one or more other (remaining) clusters are excluded from the subset of clusters. In some embodiments, a data analyst can manually select the subset of clusters. The subset of clusters can be pseudo-randomly or randomly selected. In some embodiments, one or more outlier clusters can be excluded from the subset. The excluded clusters can be the clusters that are the farthest from other clusters in the n-dimensional space. In some embodiments, clusters can be added to the subset until some threshold is satisfied, such as there are remaining clusters that are less than or equal to 20% of the total number of clusters. In some embodiments, the method 1200 systematically selects a different subset of clusters per iteration and updates the accuracy value of the model(s) such that the end result of the method 1200 may not depend on the arbitrary choice of which subset is selected.

At block 1208 a training data set can be created. The training server 130 can create, from the subset of clusters, a training data set. The training data set can include the concrete mixtures. Labels can be added to the training data set. A label can correspond to at least one of a strength value, a slump value, or a shrinkage value. The training data set can include costs and/or the performance metrics as labels. As described herein, the training server 130 can use the labels for supervised or semi-supervised machine learning.

At block 1212, one or more machine learning models can be trained. The training server 130 can train one or more machine learning models. The training server 130 can initialize the machine learning models based on the hyperparameters. The training server 130 can train a machine learning model using the training data set and the set of hyperparameters. As described herein, the machine learning model can make predictions based on input data for each concrete mixture from the training data set. In the case of neural networks or other parameterized networks, the training server 130 can use backpropagation to modify the network's weights and biases based on a comparison of the network's output and the machine learning labels. Accordingly, training server 130 can allow the machine learning model(s) to "learn" based on the training data set.

At block 1214, the one or more machine learning models can be validated using the remaining cluster(s). The training server 130 and/or a data analyst can validate the machine learning model(s). The training server 130 and/or the data analyst can validate the machine learning model(s) using the other clusters excluded from the training data set and associated costs and/or performance metrics for each concrete mixture. A concrete mixture from the excluded cluster can be provided to the one or more machine learning models and the predicted output can be compared to actual values associated with the concrete mixture. A server can generate input data for a concrete mixture from an excluded cluster. A server can invoke the machine learning model(s), where machine learning model(s) receive the input data as input and outputs a prediction based on the input data. In some embodiments, an analyst can compare the prediction to a metric associated with the concrete mixture from the excluded clusters. As described herein, in some aspects, an advantage of this approach is that the machine learning model(s) are being forced to extrapolate results from cluster data that was specifically excluded from training. As described herein, the training server 130 can calculate an accuracy value. An accuracy value, can include, but is not limited to, how accurate the model(s) predictions are compared to true data. For example, if the model(s) accurately predict 99 out of 100 samples, then the model(s) can have 99% accuracy.

At block 1216, it can be determined whether additional subsets should be processed. The method 1200 can repeat the blocks 1206, 1208, 1212, 1214 to process additional subsets of clusters and update the accuracy value until some threshold is met, such as some threshold number of different subsets have been processed (such as all of them). Accordingly, if additional subsets should be processed, the method 1200 can return to block 1206 to select a different subset of clusters. As shown the method 1200 can return to block 1206 to select a new subset of clusters, which can exclude different cluster(s). The training server 130 can select, from the clusters, a second subset of clusters different from the first subset of clusters. The method 1200 can repeat the blocks 1208, 1212 to create the training data set and continue training the machine learning model(s). In some embodiments, the training server 130 can create, from the second subset of clusters, the second training data set. At block 1214 for determining accuracy, on subsequent iterations, the training server 130 can update the accuracy value by applying a statistical measure (such as an average) to the previous accuracy value and the current accuracy value. Otherwise, the method 1200 proceeds to block 1218 to determine whether accuracy of the machine learning model(s) after training is satisfactory.

At block 1218, it can be determined whether accuracy of the machine learning model(s) is satisfactory. If the performance of the machine learning model(s) during validation are unsatisfactory, then the machine learning model(s) can be trained again after adjusting the hyperparameters. The training server 130 and/or a data analyst can apply a threshold to the accuracy value. If the accuracy value satisfies the threshold, then the accuracy of the machine learning model(s) can be satisfactory. If the accuracy value does not satisfy a threshold, then the machine learning models can be trained again with different hyperparameters. As shown the method 1200 can return to block 1203 to determine updated hyperparameters. As described herein, a data analyst can manually select hyperparameters. Additionally or alternatively, the training server 130 can select different hyperparameters from a permutation matrix. In some embodiments, at block 1204 for clustering concrete mixtures, the previous clusters can be used if no new concrete mixture data has been received; otherwise, the concrete mixture data can be clustered again. The method 1200 can repeat the blocks 1206, 1208, 1212, 1214 to select subsets, create the training data set, train the machine learning model(s), update accuracy via validation, and repeat.

Figure 13:
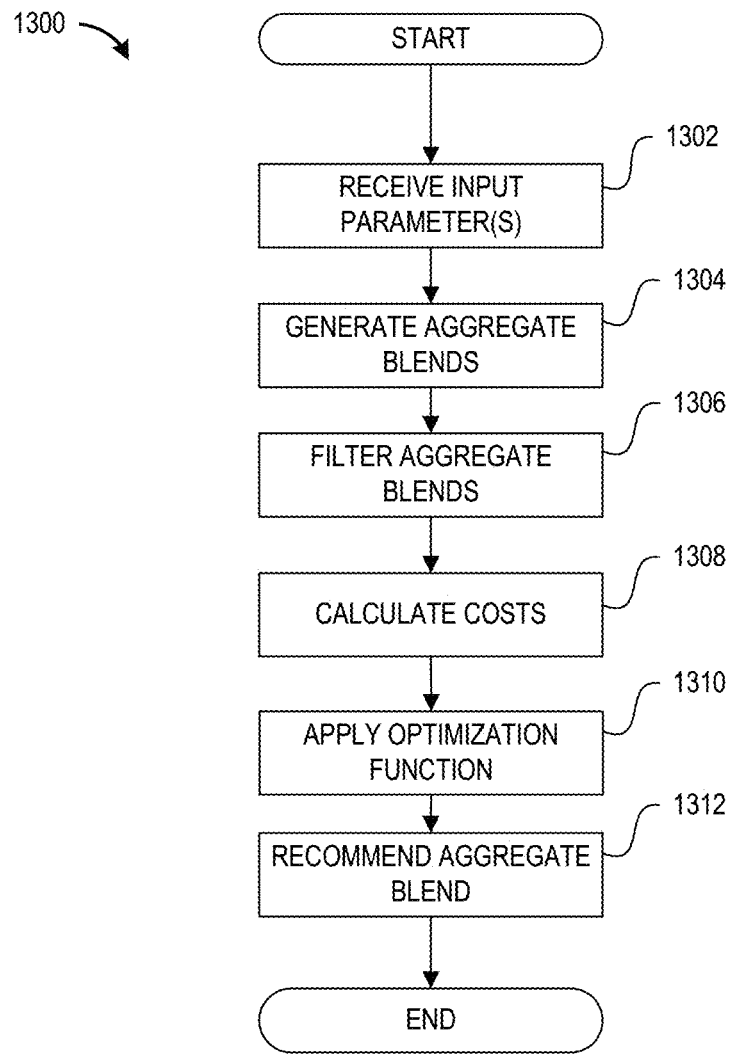
FIG. 13 is a flow chart depicting a method for artificial intelligence aggregate blend predictions.

FIG. 13 is a flow chart depicting a method 1300 implemented by the artificial intelligence prediction system 104 for aggregate blend predictions. Some aspects of the method 1300 may be implemented by components of the artificial intelligence prediction system 104, such as the ingestion server(s) 150, the training server(s) 130, the prediction server(s) 110, and/or the user interface server 120.

Beginning at block 1302, input parameter(s) can be received. The artificial intelligence prediction system 104 can receive one or more input parameters related to generating an aggregate blend. The one or more input parameters can be received via a graphical user interface of the artificial intelligence prediction system 104. The one or more input parameters can include the constituents of an aggregate blend. The input parameters can include, but are not limited to, one or more coarse aggregates (such as "#57 Crushed Basalt" and "Pea Gravel," for example), one or more fine aggregates (such as "Basalt Sand" and "Concrete Sand," for example), and/or a cementitious weight (such as 564 lb/yd$^3$, for example). In some embodiments, a user can select the input parameters from different available options. In some embodiments, the different available options can be specific to a particular organization and/or plant. Additional details regarding receiving input parameters are described herein, such as with respect to FIG. 8A.

At block 1304, candidate aggregate blends can be generated. The prediction server 110 can generate the candidate aggregate blends. The prediction server 110 can receive the input parameters (such as possible constituents that can be used in an aggregate blend). The prediction server 110 can generate a permutation matrix for the possible constituents and vary each possible value starting from an initial value, increasing by a step value, until a threshold value is satisfied. For example, one candidate aggregate blend from the permutation matrix can include an aggregate blend with a first coarse aggregate with a value (such as "#57 Crushed Basalt" at 23%), a second coarse aggregate with a value (such as "Pea Gravel" at 21%), a first fine aggregate of with a value (such as Basalt Sand" at 33%), and a second fine aggregate of with a value (such as "Concrete Sand" at 23%). The prediction server 110 can use the permutation matrix to determine the various combinations of possibilities for candidate aggregate blends.

At block 1306, the candidate aggregate blends can be filtered. The prediction server 110 can filter the candidate aggregate blends based on domain knowledge rules. The domain knowledge rules can be related to Shilstone visualizations, tarantula visualizations, and/or Power 45 visualizations. The prediction server 110 can identify, from the candidate aggregate blends, a filtered set of candidate aggregate blends. The prediction server 110 can calculate a particular performance metric for a particular aggregate blend from the candidate aggregate blends. The prediction server 110 can determine that the particular performance metric for the particular aggregate blend fails to satisfy a domain threshold. The prediction server 110 can exclude the particular aggregate blend from the filtered set of candidate aggregate blends. After applying the domain knowledge rules, the candidate aggregate blends in the filtered set of candidate aggregate blends can be those blends that satisfy the applied rules.

In some embodiments, the prediction server 110 can apply a threshold related to Shilstone visualizations. As described herein, the prediction server 110 can calculate coarseness and workability factors for the candidate aggregate blend. If the coarseness and/or workability factors for the candidate aggregate blend is outside of one or more target ranges, then the candidate aggregate blend can be excluded from the filtered set of candidate aggregate blends.

In some embodiments, the prediction server 110 can apply a threshold related to tarantula visualizations. As described herein, the prediction server 110 can determine an expected retention for different sieve sizes for the candidate aggregate blend. If the expected retention for different sieve sizes for the candidate aggregate blend is outside of one or more target ranges, then the candidate aggregate blend can be excluded from the filtered set of candidate aggregate blends.

In some embodiments, the prediction server 110 can apply a threshold related to Power 45 visualizations. As described herein, the prediction server 110 can determine an amount passing for a particular sieve size for the candidate aggregate blend. If the amount passing for the particular sieve size for the candidate aggregate blend is outside of one or more target ranges, then the candidate aggregate blend can be excluded from the filtered set of candidate aggregate blends.

At block 1308, costs can be calculated for the candidate aggregate blends from the filtered set of candidate aggregate blends. The prediction server 110 can calculate a cost associated with a candidate aggregate blend. In some embodiments, the materials data storage 116 can store a cost per unit for each constituent in the aggregate blend and calculate a total cost based on the constituent values and the total cementitious weight. Additionally or alternatively, the prediction server 110 can use a machine learning model to calculate an estimated cost for the candidate aggregate blend.

At block 1310, an optimization function can be applied. The prediction server 110 can apply an optimization function to the costs associated with the filtered candidates. The optimization function can select a first cost associated with the first candidate aggregate blend over a second cost associated with the second candidate aggregate blend. As described herein, the optimization function can select the candidate aggregate blend with the lowest predicted cost.

At block 1312, an aggregate blend can be recommended. The prediction server 110 can receive the selected candidate aggregate blend from the optimization function and provide the selected aggregate blend as a recommendation. As described herein, the artificial intelligence prediction system 104 can present the recommendation in a graphical user interface. Additional details regarding provided a recommended aggregate blend are described herein, such as with respect to FIGS. 8A-8B.

Figure 14:
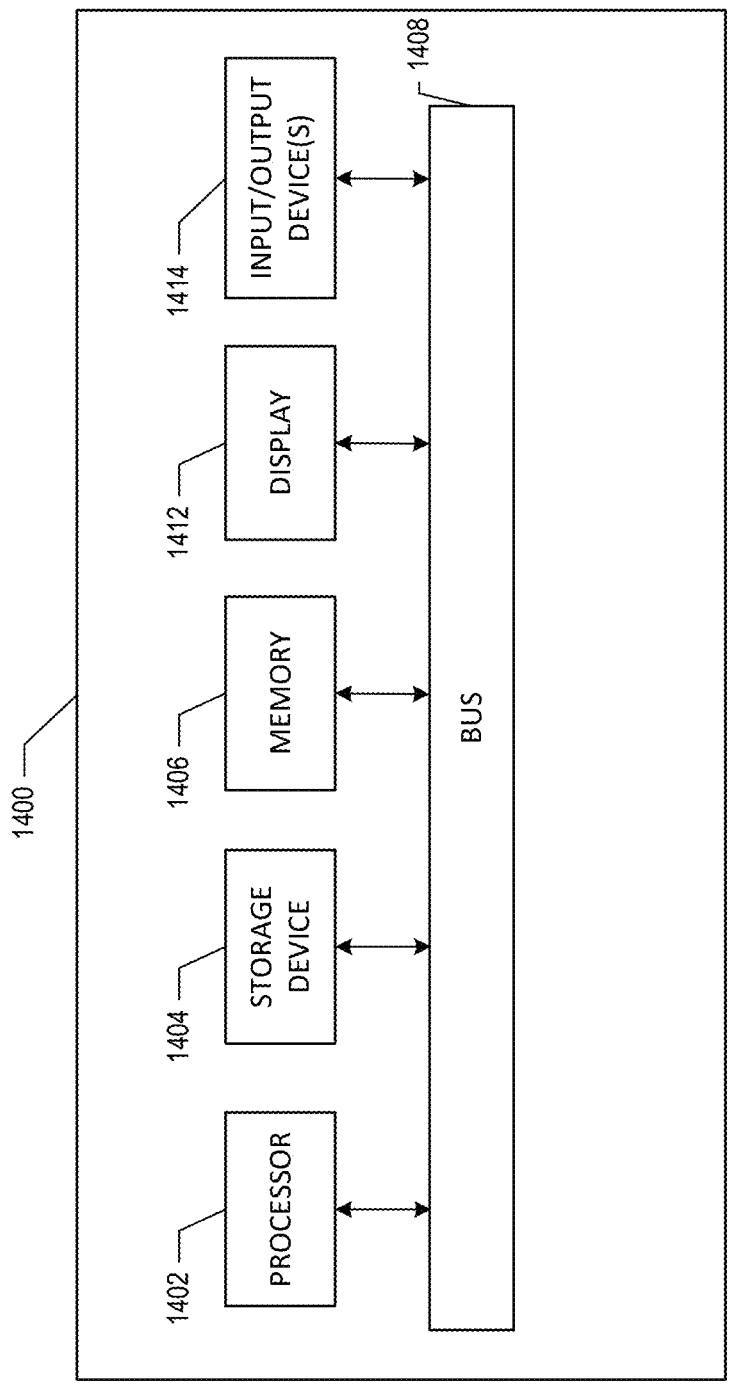
FIG. 14 is a block diagram illustrating an example computing system with which various methods and systems discussed herein may be implemented.

FIG. 14 is a block diagram that illustrates example components of a computing device 1400. The computing device 1400 can implement aspects of the present disclosure. Using FIG. 1 as an example, the prediction server 110, the ingestion server 150, the training server 130, or the user interface server 120 of FIG. 1 can be implemented in a similar manner as the computing device 1400. The computing device 1400 can communicate with other computing devices.

The computing device 1400 can include a hardware processor 1402, a data storage device 1404, a memory device 1406, a bus 1408, a display 1412, and one or more input/output devices 1414. The hardware processor 1402 can also be implemented as a combination of computing devices, e.g., a combination of a digital signal processor and a microprocessor, a plurality of microprocessors, one or more microprocessors in conjunction with a digital signal processor, or any other such configuration. The hardware processor 1402 can be configured, among other things, to execute instructions to perform one or more functions. The data storage device 1404 can include a magnetic disk, optical disk, solid state drive, or flash drive, etc., and is provided and coupled to the bus 1408 for storing information and instructions. The memory device 1406 can include one or more memory devices that store data, such as, without limitation, random access memory (RAM) and read-only memory (ROM). The computing device 1400 may be coupled via the bus 1408 to the display 1412, such as an LCD display or touch screen, for displaying information to a user, such as an engineer. The computing device 1400 may be coupled via the bus 1408 to one or more input/output devices 1414. The input device 1414 can include, but is not limited to, a keyboard, mouse, digital pen, microphone, or touch screen.

A machine learning application may be stored on the memory device 1406 and executed as a service by the hardware processor 1402. In some embodiments, the machine learning application may implement various aspects of the present disclosure. For example, the machine learning application may train a machine learning model configured to predict the performance of a concrete mixture.

It is to be understood that not necessarily all objects or advantages may be achieved in accordance with any particular embodiment described herein. Certain embodiments may be configured to operate in a manner that achieves or optimizes one advantage or group of advantages as taught herein without necessarily achieving other objects or advantages as may be taught or suggested herein.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language used herein, such as, among others, "can," "might," "may," "e.g.," "for example," and the like, unless specifically stated otherwise, or otherwise understood within the context as used, is generally intended to convey that certain embodiments include, while other embodiments do not include, certain features, elements, or states. Thus, such conditional language is not generally intended to imply that features, elements or states are in any way required for one or more embodiments.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Such disjunctive language is not generally intended to, and should not, imply that certain embodiments require at least one of X, at least one of Y, and at least one of Z to each be present. Thus, the term "or" is used in its inclusive sense (and not in its exclusive sense) so that when used, for example, to connect a list of elements, the term "or" means one, some, or all of the elements in the list.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved.

The term "a" as used herein should be given an inclusive rather than exclusive interpretation. For example, unless specifically noted, the term "a" should not be understood to mean "exactly one" or "one and only one"; instead, the term "a" means "one or more" or "at least one," whether used in the claims or elsewhere in the specification and regardless of uses of quantifiers such as "at least one," "one or more," or "a plurality" elsewhere in the claims or specification.

The terms "comprising," "including," "having," and the like are synonymous and are used inclusively, in an open-ended fashion, and do not exclude additional elements, features, acts, operations, and so forth.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments described herein can be embodied within a form that does not provide all of the features and benefits set forth herein, as some features can be used or practiced separately from others.

What is claimed is:

1. A system comprising:
    a data storage medium; and
    one or more computer hardware processors in communication with the data storage medium, wherein the one or more computer hardware processors are configured to execute computer-executable instructions to at least:
        receive one or more input parameters related to generating an artificial intelligence concrete mixture;
        receive a first constraint on the artificial intelligence concrete mixture, wherein the first constraint comprises a threshold on a concrete mixture constituent;
        generate a plurality of candidate concrete mixtures;
        identify, from the plurality of candidate concrete mixtures, a subset of candidate concrete mixtures, wherein identifying the subset of candidate concrete mixtures comprises:
            determining that a candidate concrete mixture from the subset satisfies the threshold on the concrete mixture constituent;
        for each particular candidate concrete mixture from the subset of candidate concrete mixtures,
            generate input data for the particular candidate concrete mixture; and
            invoke a machine learning model, wherein the machine learning model receives the input data as input, wherein the machine learning model outputs a prediction based on the input data;
        identify, from the subset of candidate concrete mixtures, a filtered set of candidate concrete mixtures, wherein the filtered set of candidate concrete mixtures comprises (i) a first candidate concrete mixture and (ii) a second candidate concrete mixture, wherein identifying the filtered set of candidate concrete mixtures comprises:
determining that a particular prediction for the particular candidate concrete mixture fails to satisfy a target performance threshold based on the one or more input parameters;
apply an optimization function to the first candidate concrete mixture and the second candidate concrete mixture, wherein the optimization function selects the first candidate concrete mixture over the second candidate concrete mixture; and
provide the first candidate concrete mixture as the artificial intelligence concrete mixture.

2. The system of claim 1, wherein the one or more computer hardware processors are further configured to execute computer-executable instructions to at least:
calculate a coarseness factor value for the first candidate concrete mixture;
calculate a workability factor value for the first candidate concrete mixture; and
present, in a graphical user interface, a Shilstone visualization comprising a point in the Shilstone visualization representing the coarseness factor value and the workability factor value.

3. The system of claim 1, wherein the one or more computer hardware processors are further configured to execute computer-executable instructions to at least:
determine an expected retention value for the first candidate concrete mixture for a particular sieve size; and
present, in a graphical user interface, a tarantula visualization comprising a point in the tarantula visualization representing the expected retention value for the particular sieve size.

4. The system of claim 1, wherein the one or more input parameters comprise the target performance threshold.

5. The system of claim 1, wherein the target performance threshold corresponds to at least one of a strength threshold, a slump threshold, or a shrinkage threshold.

6. The system of claim 1, wherein the one or more input parameters comprise a reference concrete mixture, and wherein the one or more computer hardware processors are further configured to execute computer-executable instructions to at least:
generate reference input data for the reference concrete mixture; and
invoke the machine learning model, wherein the machine learning model receives the reference input data as input, wherein the machine learning model outputs a reference prediction based on the reference input data, wherein the target performance threshold is based on the reference prediction.

7. A system comprising:
a data storage medium; and
one or more computer hardware processors in communication with the data storage medium, wherein the one or more computer hardware processors are configured to execute computer-executable instructions to at least:
receive one or more input parameters related to generating an artificial intelligence concrete mixture, the one or more input parameters comprising a cost and global warming potential objective;
generate a plurality of candidate concrete mixtures;
for each particular candidate concrete mixture from the plurality of candidate concrete mixtures,
generate input data for the particular candidate concrete mixture; and
invoke a machine learning model, wherein the machine learning model receives the input data as input, wherein the machine learning model outputs a respective prediction based on the input data;
identify, from the plurality of candidate concrete mixtures, a filtered set of candidate concrete mixtures, wherein the filtered set of candidate concrete mixtures comprises (i) a first candidate concrete mixture and (ii) a second candidate concrete mixture, wherein identifying the filtered set of candidate concrete mixtures comprises:
determining that a particular prediction for the particular candidate concrete mixture fails to satisfy a target performance threshold based on the one or more input parameters;
apply an optimization function to the first candidate concrete mixture and the second candidate concrete mixture according to the cost and global warming potential objective, wherein the optimization function selects the first candidate concrete mixture over the second candidate concrete mixture; and
provide the first candidate concrete mixture as the artificial intelligence concrete mixture.

8. The system of claim 7, wherein generating input data for the particular candidate concrete mixture comprises:
determining a first feature corresponding to a water-to-cementitious material ratio for the particular candidate concrete mixture;
determining a second feature corresponding to an aggregate density value for the particular candidate concrete mixture;
determining a third feature corresponding to an aggregate water absorption value for the particular candidate concrete mixture;
determining a fourth feature corresponding to an aggregate fineness modulus value for the particular candidate concrete mixture;
determining a fifth feature for an amount of a concrete mixture constituent in the particular candidate concrete mixture; and
converting the first feature, second feature, third feature, fourth feature, and fifth feature to vector data, wherein the input data comprises the vector data.

9. The system of claim 7, wherein generating the plurality of candidate concrete mixtures comprises:
creating the first candidate concrete mixture comprising a plurality of concrete mixture constituents;
assigning a first value for a first concrete mixture constituent in the plurality of concrete mixture constituents for the first candidate concrete mixture;
adding the first candidate concrete mixture to the plurality of candidate concrete mixtures;
combining the first value and a step value to result in a second value;
creating a second candidate concrete mixture comprising the plurality of concrete mixture constituents;
assigning the second value for the first concrete mixture constituent for the second candidate concrete mixture; and
adding the second candidate concrete mixture to the plurality of candidate concrete mixtures.

10. The system of claim 7, wherein generating the plurality of candidate concrete mixtures comprises:
creating a second candidate concrete mixture comprising a plurality of concrete mixture constituents;

determining a value associated with the second candidate concrete mixture;

determining that the value associated with the second candidate concrete mixture fails to satisfy a domain threshold; and excluding the second candidate concrete mixture from the plurality of candidate concrete mixtures.

11. The system of claim 7, wherein the one or more input parameters comprise a reference concrete mixture.

12. The system of claim 11, wherein the one or more computer hardware processors are further configured to execute computer-executable instructions to at least:

calculate a first performance metric associated with the first candidate concrete mixture;

calculate a second performance metric associated with the reference concrete mixture; and cause presentation, in a graphical user interface, of a visualization comprising the first performance metric and the second performance metric.

13. The system of claim 7, wherein the one or more computer hardware processors are further configured to execute computer-executable instructions to at least:

generate first input data for the first candidate concrete mixture;

for each particular machine learning model from a plurality of machine learning models,
  invoke the particular machine learning model, wherein the particular machine learning model receives the first input data as input; and
apply a statistical measure to output from each particular machine learning model from the plurality of machine learning models, wherein application of the statistical measure outputs a first prediction.

14. The system of claim 13, wherein the one or more computer hardware processors are further configured to execute computer-executable instructions to at least:

calculate a confidence interval from the output from each particular machine learning model from the plurality of machine learning models, wherein identifying the filtered set of candidate concrete mixtures comprises:
  determining that the first prediction combined with the confidence interval satisfies the target performance threshold.

15. A method comprising:

generating a plurality of clusters from a plurality of concrete mixtures;

selecting, from the plurality of clusters, a first subset of clusters, wherein one or more other clusters from the plurality of clusters are excluded from the first subset of clusters;

creating, from the first subset of clusters, a first training data set;

determining a first set of hyperparameters;

training a first machine learning model using the first training data set and the first set of hyperparameters;

validating the first machine learning model using the one or more other clusters;

determining a second set of hyperparameters different from the first set of hyperparameters; and training a second machine learning model using a second training data set and the second set of hyperparameters.

16. The method of claim 15, wherein generating the plurality of clusters comprises:

applying a K-means clustering algorithm to the plurality of concrete mixtures.

17. The method of claim 15, wherein creating the first training data set comprises:

adding a label to the first training data set, wherein the label corresponds to at least one of: a strength value, a slump value, or a shrinkage value.

18. The method of claim 15 comprising:

selecting, from the plurality of clusters, a second subset of clusters different from the first subset of clusters; and creating, from the second subset of clusters, the second training data set.

19. The method of claim 15, wherein validating the first machine learning model comprises:

generate input data for a concrete mixture from the one or more other clusters;

invoke the first machine learning model, wherein the first machine learning model receives the input data as input, wherein the first machine learning model outputs a prediction based on the input data; and compare the prediction to a metric associated with the concrete mixture from the one or more other clusters.

20. The method of claim 15, wherein the first set of hyperparameters comprises at least one of a number of neurons, a number of layers, a number of training epochs, an activation function, an optimizer, a learning rate, a batch size, or a regularization parameter.

* * * * *